(12) United States Patent
Kim et al.

(10) Patent No.: US 11,462,613 B2
(45) Date of Patent: Oct. 4, 2022

(54) SEMICONDUCTOR DEVICE

(71) Applicant: SAMSUNG ELECTRONICS CO., LTD., Suwon-si (KR)

(72) Inventors: Ju Youn Kim, Suwon-si (KR); Sang Jung Kang, Suwon-si (KR); Ji Su Kang, Seoul (KR); Yun Sang Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 17/032,261

(22) Filed: Sep. 25, 2020

(65) Prior Publication Data

US 2021/0328010 A1 Oct. 21, 2021

(30) Foreign Application Priority Data

Apr. 17, 2020 (KR) .................. 10-2020-0046578

(51) Int. Cl.
*H01L 29/06* (2006.01)
*H01L 27/092* (2006.01)
(Continued)

(52) U.S. Cl.
CPC ..... *H01L 29/0653* (2013.01); *H01L 21/76224* (2013.01); *H01L 21/823821* (2013.01);
(Continued)

(58) Field of Classification Search
CPC ......... H01L 21/02603; H01L 21/76224; H01L 21/823431; H01L 21/823481; H01L 21/823821; H01L 21/823878; H01L 21/845; H01L 27/0886; H01L 27/0924; H01L 27/10879; H01L 27/1211; H01L 29/0649; H01L 29/0653; H01L 29/0665; H01L 29/0669; H01L 29/0673; H01L 29/0847; H01L 29/41733; H01L 29/41791;
(Continued)

(56) References Cited

U.S. PATENT DOCUMENTS 7,806,584 B2   10/2010   Wootan et al.
7,831,287 B2   11/2010   Brister et al.
(Continued)

FOREIGN PATENT DOCUMENTS

KR   10-2016-0066103 A   6/2016
KR   10-2018-0032505 A   3/2018

*Primary Examiner* — David C Spalla
(74) *Attorney, Agent, or Firm* — Lee IP Law, P.C.

(57) ABSTRACT

A semiconductor device includes first to sixth active patterns extending in a first direction and spaced apart in the first direction and a second direction; a field insulating layer between the first and second active patterns, an upper surface thereof being lower than upper surfaces of the first and second active patterns; a first gate structure on the field insulating layer and the first active pattern and extending in the second direction; a second gate structure on the field insulating layer and the second active pattern and extending in the second direction; a first separation trench extending between the second and third active patterns and the fifth and sixth active patterns, and a second separation trench extending between the first and second gate structures, wherein a lowest surface of the first separation trench is higher than a lowest surface of the second separation trench.

19 Claims, 20 Drawing Sheets

(51) Int. Cl.
  *H01L 29/08* (2006.01)
  *H01L 29/417* (2006.01)
  *H01L 29/78* (2006.01)
  *H01L 29/423* (2006.01)
  *H01L 29/786* (2006.01)
  *H01L 29/66* (2006.01)
  *H01L 21/762* (2006.01)
  *H01L 21/8238* (2006.01)

(52) U.S. Cl.
  CPC .. *H01L 21/823878* (2013.01); *H01L 27/0924* (2013.01); *H01L 29/0673* (2013.01); *H01L 29/0847* (2013.01); *H01L 29/41733* (2013.01); *H01L 29/41791* (2013.01); *H01L 29/42392* (2013.01); *H01L 29/66545* (2013.01); *H01L 29/7851* (2013.01); *H01L 29/78618* (2013.01); *H01L 29/78696* (2013.01)

(58) Field of Classification Search
  CPC ......... H01L 29/42392; H01L 29/66439; H01L 29/66545; H01L 29/66795; H01L 29/775; H01L 29/785; H01L 29/7851; H01L 29/7853; H01L 29/7855; H01L 29/78618; H01L 29/78696; H01L 2029/7858
  See application file for complete search history.

(56) References Cited

U.S. PATENT DOCUMENTS

| | | | |
|---|---|---|---|
| 8,021,480 B2 | 9/2011 | Hansen et al. | |
| 8,334,015 B2 | 12/2012 | Chiang et al. | |
| 8,423,114 B2 | 4/2013 | Simpson et al. | |
| 8,945,328 B2 | 2/2015 | Longinotti-Buitoni et al. | |
| 9,373,624 B1 | 6/2016 | Balakrishnan et al. | |
| 9,379,106 B2 | 6/2016 | Hong et al. | |
| 9,406,676 B2 | 8/2016 | Yu et al. | |
| 9,425,237 B2 | 8/2016 | Jo | |
| 9,529,956 B2 | 12/2016 | Liao et al. | |
| 9,563,733 B2 | 2/2017 | Becker | |
| 9,831,272 B2 | 11/2017 | Chen et al. | |
| 9,865,704 B2 | 1/2018 | Xie et al. | |
| 10,366,196 B2 | 7/2019 | Correale, Jr. et al. | |
| 10,872,961 B2 * | 12/2020 | Chung | H01L 27/0886 |
| 2015/0097251 A1 * | 4/2015 | Kwon | H01L 21/845 438/587 |
| 2016/0043222 A1 * | 2/2016 | Cho | H01L 27/0207 257/369 |
| 2016/0163718 A1 * | 6/2016 | Park | H01L 21/823431 257/195 |
| 2016/0268393 A1 * | 9/2016 | Hong | H01L 21/823481 |
| 2019/0165094 A1 * | 5/2019 | Ching | H01L 29/0649 |

* cited by examiner

SEMICONDUCTOR DEVICE

CROSS-REFERENCE TO RELATED APPLICATION

Korean Patent Application No. 10-2020-0046578, filed on Apr. 17, 2020, in the Korean Intellectual Property Office, and entitled: "Semiconductor Device," is incorporated by reference herein in its entirety.

BACKGROUND

1. Field

Embodiments relate to a semiconductor device.

2. Description of the Related Art

As one of the scaling techniques for increasing the density of a semiconductor device, a multi-gate transistor has been suggested. The multi-gate transistor may be obtained by forming a fin-shaped or nanowire-shaped multi-channel active pattern (or silicon body) on a substrate and forming gates on the surface of the multi-channel active pattern.

SUMMARY

The embodiments may be realized by providing a semiconductor device including a first active pattern that extends in a first direction; a second active pattern that extends in the first direction and is spaced apart from the first active pattern in the first direction; a third active pattern that extends in the first direction and is spaced apart from the second active pattern in the first direction; a fourth active pattern that extends in the first direction and is spaced apart from the first active pattern in a second direction perpendicular to the first direction; a fifth active pattern that extends in the first direction and is spaced apart from the fourth active pattern in the first direction; a sixth active pattern that extends in the first direction and is spaced apart from the fifth active pattern in the first direction; a field insulating layer between the first active pattern and the second active pattern, an upper surface of the field insulating layer being lower than an upper surface of the first active pattern and lower than an upper surface of the second active pattern; a first gate structure on the field insulating layer and the first active pattern, the first gate structure extending in the second direction to intersect the fourth active pattern; a second gate structure on the field insulating layer and the second active pattern, the second gate structure extending in the second direction to intersect the fifth active pattern; a first separation trench extending in the second direction between the second active pattern and the third active pattern and between the fifth active pattern and the sixth active pattern, the first separation trench including a first element isolation layer filled therein; and a second separation trench extending in the second direction between the first gate structure and the second gate structure, the second separation trench including a second element isolation layer filled therein, wherein a lowest surface of the first separation trench is higher than a lowest surface of the second separation trench.

The embodiments may be realized by providing a semiconductor device including a first active pattern and a second active pattern that are separated by a first separation trench and that extend in a first direction; a third active pattern that is spaced apart from the first active pattern in a second direction and that extends in the first direction; a fourth active pattern that is spaced apart from the second active pattern in the second direction and that extends in the first direction; at least one first wire pattern on the first active pattern, spaced apart from the first active pattern in a third direction, and partially overlapping the first active pattern; at least one second wire pattern on the second active pattern, spaced apart from the second active pattern in the third direction, and partially overlapping the second active pattern; at least one third wire pattern on the third active pattern and spaced apart from the third active pattern in the third direction; at least one fourth wire pattern on the fourth active pattern and spaced apart from the fourth active pattern in the third direction; a first gate structure that covers the at least one first wire pattern and the at least one third wire pattern and extends in the second direction; and a second gate structure that covers the at least one second wire pattern and the at least one fourth wire pattern and extends in the second direction, wherein the third active pattern and the fourth active pattern are separated by a second separation trench, and a width of the first separation trench in the first direction is greater than a width of the second separation trench in the first direction.

The embodiments may be realized by providing a semiconductor device including a first active pattern and a second active pattern on a first area of a substrate, the first active pattern and the second active pattern each extending in a first direction and being spaced apart from each other in the first direction; a third active pattern on the first area of the substrate, the third active pattern extending in the first direction and being separated from the second active pattern by a first element isolation layer; a fourth active pattern on a second area of the substrate, the fourth active pattern extending in the first direction and being spaced apart from the first active pattern in a second direction; a fifth active pattern on the second area of the substrate, the fifth active pattern extending in the first direction and being separated from the fourth active pattern by a second element isolation layer; a sixth active pattern on the second area of the substrate, the sixth active pattern extending in the first direction and being separated from the fifth active pattern by the first element isolation layer; a first gate structure that extends in the second direction, overlaps an end of the first active pattern, and intersects the fourth active pattern; a second gate structure that extends in the second direction, overlaps an end of the second active pattern, and intersects the fifth active pattern; source/drain regions on the first through sixth active patterns; a first interlayer insulating film on an upper surface of the first gate structure and an upper surface of the second gate structure; contacts in the first interlayer insulating film, the contacts being connected to the source/drain regions; a second interlayer insulating film on the first interlayer insulating film and the contacts; and wiring structures in the second interlayer insulating film and connected to the contacts, wherein the second element isolation layer is between the first gate structure and the second gate structure, an upper surface of the first element isolation layer or an upper surface of the second element isolation layer is lower than upper surfaces of the contacts, a lower surface of the first element isolation layer or a lower surface of the second element isolation layer is lower than lower surfaces of the source/drain regions, and a depth of the first element isolation layer in a third direction is smaller than a depth of the second element isolation layer in the third direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
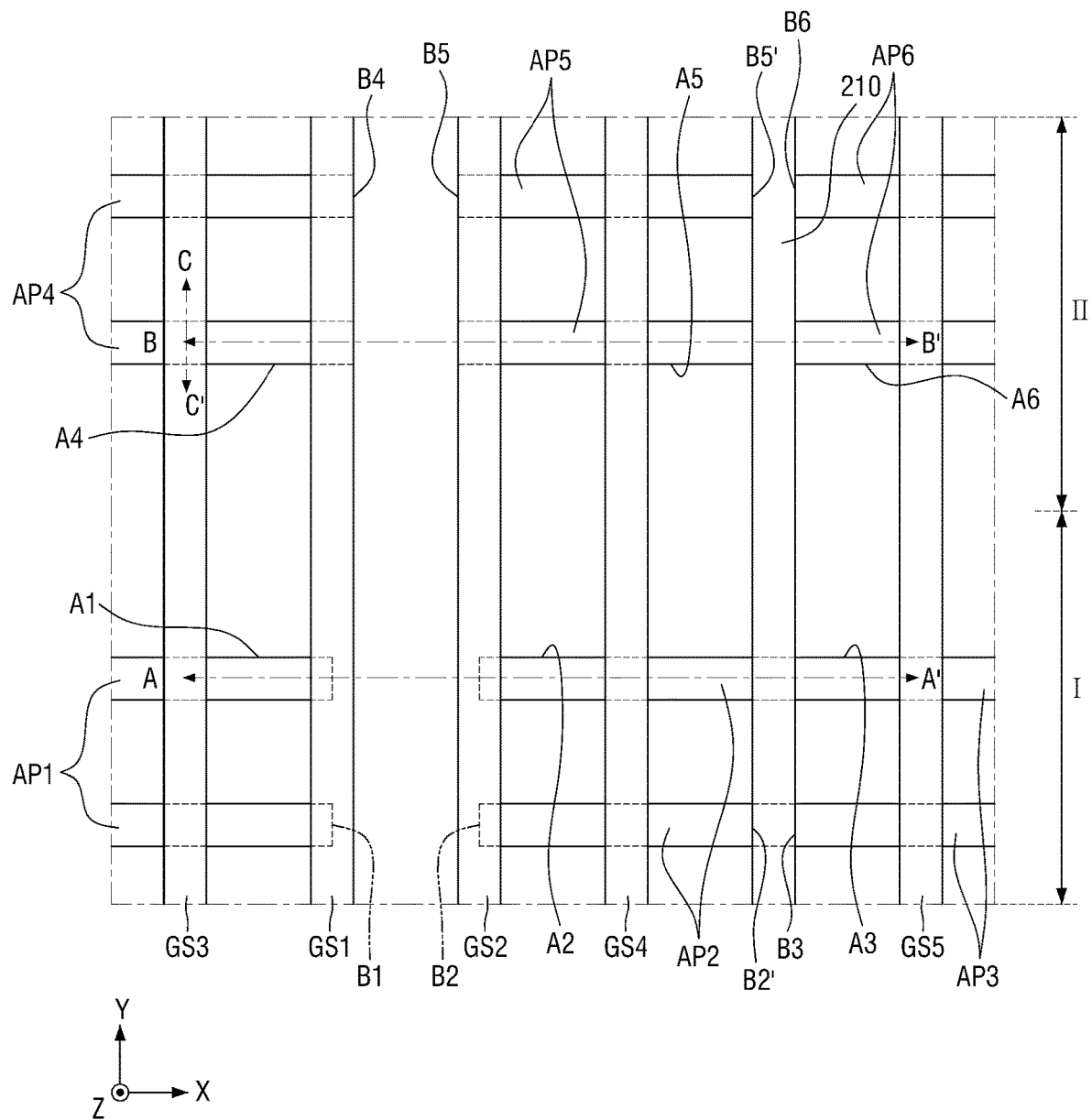
FIG. 1 illustrates a schematic layout view of a semiconductor device according to some embodiments of the present disclosure.

In the drawings relating to semiconductor devices according to embodiments of the present disclosure, a fin field effect transistor (FinFET) including a fin pattern-shaped channel region and a multi-bridge-channel FET (MBCFET) including a nanowire- or nanosheet-shaped channel region are illustrated. However, the technical spirit of the present disclosure is not limited thereto. For example, a semiconductor device according to embodiments of the present disclosure may include a tunneling FET, a gate-all-around FET (GAAFET), or a three-dimensional (3D) transistor. In addition, for example, a semiconductor device according to embodiments of the technical spirit of the present disclosure include a bipolar junction transistor, a lateral double diffused metal oxide semiconductor transistor (LDMOS), or the like.

Figure 2:
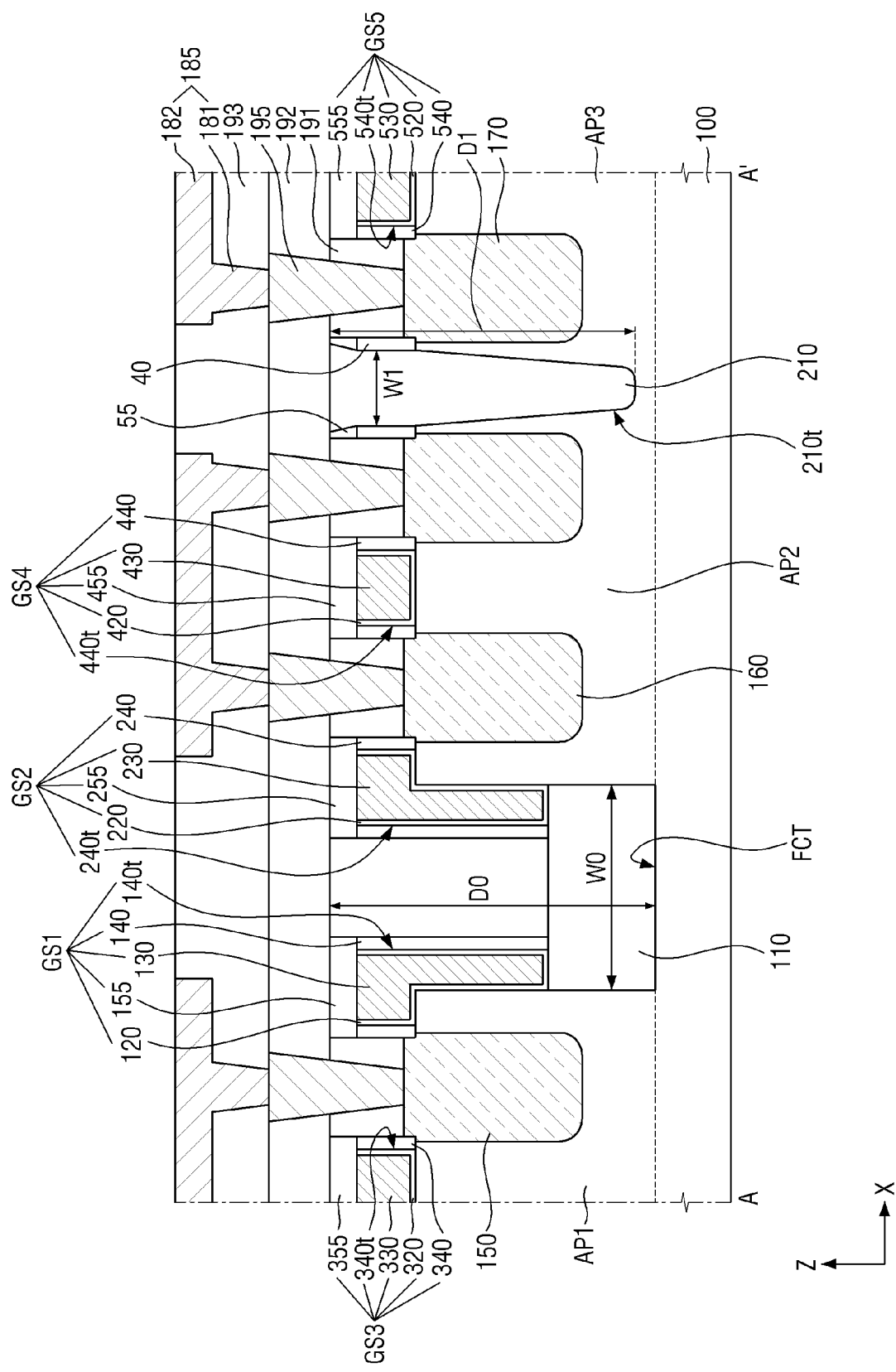
FIG. 2 illustrates a cross-sectional view taken along line A-A' of FIG. 1.
Figure 3:
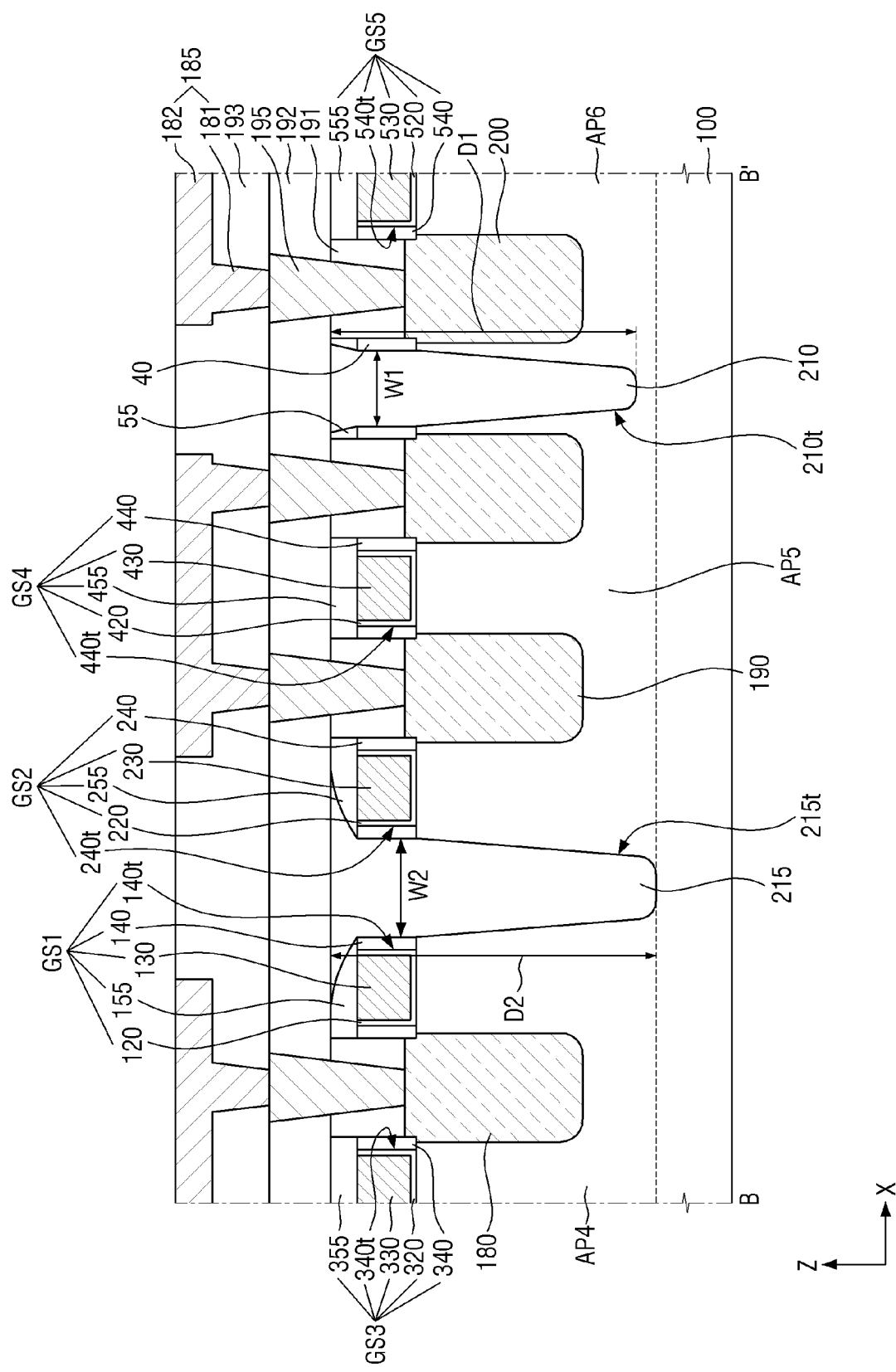
FIG. 3 illustrates a cross-sectional view taken along line B-B' of FIG. 1.
Figure 4:
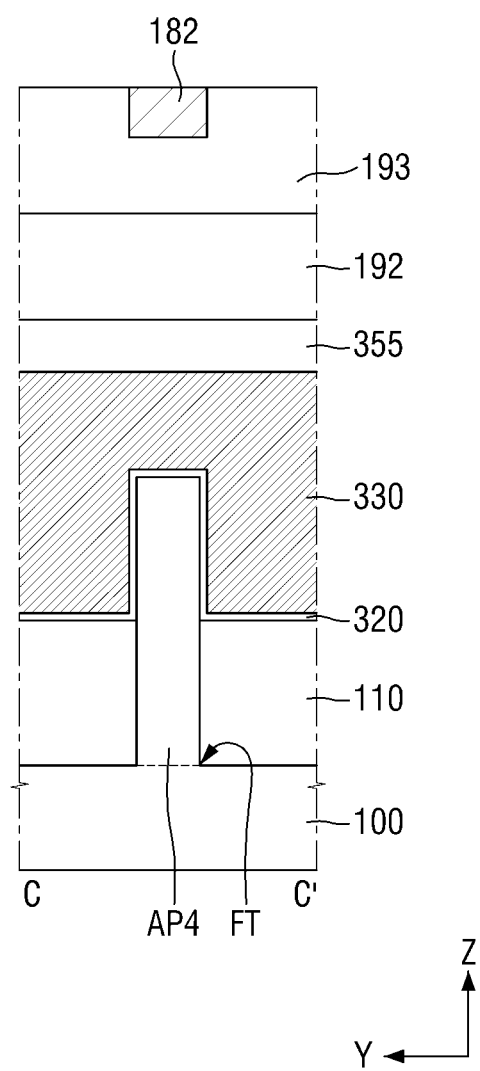
FIG. 4 illustrates a cross-sectional view taken along line C-C' of FIG. 1.

FIG. 1 is a schematic layout view of a semiconductor device according to embodiments of the present disclosure. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. For ease of description, a first interlayer insulating film 191 and a second interlayer insulating film 192 are not illustrated in FIG. 1.

Referring to FIGS. 1 through 4, the semiconductor device according to the embodiments of the present disclosure may include first through sixth active patterns AP1 through AP6, a field insulating layer 110, first through fifth gate structures GS1 through GS5, a first element isolation layer 210, a second element isolation layer 215, the first interlayer insulating film 191, and the second interlayer insulating film 192.

A substrate 100 may be bulk silicon or silicon-on-insulator (SOI). In an implementation, the substrate 100 may be, e.g., a silicon substrate or a substrate made of silicon germanium, silicon germanium on insulator (SGOI), indium antimonide, lead telluride, indium arsenide, indium phosphide, gallium arsenide, or gallium antimonide. As used herein, the term "or" is not an exclusive term, e.g., "A or B" would include A, B, or A and B.

The substrate 100 may include a first area I and a second area II. The first area I and the second area II may be spaced apart from each other or may be connected to each other. In the first area I and the second area II, semiconductor elements of the same conductivity type may be formed, or semiconductor devices of different conductivity types may be formed. Hereinafter, the first area I will be described as an n type metal oxide semiconductor (NMOS) area, and the second area II will be described as a p type metal oxide semiconductor (PMOS) area.

Each of the first through sixth active patterns AP1 through AP6 may protrude from the substrate 100 (e.g., in a vertical or third direction Z). Each of the first through sixth active patterns AP1 through AP6 may be on the substrate 100 and may extend (e.g., lengthwise) in a first direction X. In an implementation, each of the first through sixth active patterns AP1 through AP6 may include long sides extending in the first direction X and short sides extending in a second direction Y (e.g., perpendicular to the first direction X). In addition, the long sides A1, A2, A3, A4, A5 or A6 of each of the first through sixth active patterns AP1 through AP6 may be defined by a fin trench FT. The first through third active patterns AP1 through AP3 may be on the first area I of the substrate 100. The first through third active patterns AP1 through AP3 may be aligned in or along the first direction X which is a longitudinal direction. The first active pattern AP1 may be spaced apart from the second active pattern AP2 in the first direction X. A short side B1 of the first active pattern AP1 and a short side B2 of the second active pattern AP2 may face each other. The first active pattern AP1 and the second active pattern AP2 may be separated by a fin cut trench FCT. The short side B1 of the first active pattern AP1 and the short side B2 of the second active pattern AP2 may be defined by the fin cut trench FCT.

The second active pattern AP2 may be spaced apart from the third active pattern AP3 in the first direction X. A short side B2' of the second active pattern AP2 and a short side B3 of the third active pattern AP3 may face each other. The second active pattern AP2 and the third active pattern AP3 may be separated by a first separation trench 210*t*. The short side B2' of the second active pattern AP2 and the short side B3 of the third active pattern AP3 may be defined by the first separation trench 210*t*.

In an implementation, a width W1 of the first separation trench 210*t* in the first direction X may be smaller than a width W0 of the fin cut trench FCT in the first direction X.

The fourth through sixth active patterns AP4 through AP6 may be spaced apart from the first through third active patterns AP1 through AP3 in the second direction Y, respectively. A long side A4 of the fourth active pattern AP4 may face a long side A1 of the first active pattern AP1, a long side A5 of the fifth active pattern AP5 may face a long side A2 of the second active pattern AP2, and a long side A6 of the sixth active pattern AP6 may face a long side A3 of the third active pattern AP3. In an implementation, as illustrated in the drawings, each of the first through sixth active patterns AP1 through AP6 may be provided in plural numbers.

The fourth through sixth active patterns AP4 through AP6 may be on the second area II of the substrate 100. The fourth through sixth active patterns AP4 through AP6 may be aligned in the first direction X. The fourth active pattern AP4 may be spaced apart from the fifth active pattern AP5 in the first direction X. A short side B4 of the fourth active pattern AP4 and a short side B5 of the fifth active pattern AP5 may face each other. The fourth active pattern AP4 and the fifth active pattern AP5 may be separated by a second separation trench 215t. The short side B4 of the fourth active pattern AP4 and the short side B5 of the fifth active pattern AP5 may be defined by the second separation trench 215t.

The fifth active pattern AP5 may be spaced apart from the sixth active pattern AP6 in the first direction X. A short side B5' of the fifth active pattern AP5 and a short side B6 of the sixth active pattern AP6 may face each other. The fifth active pattern AP5 and the sixth active pattern AP6 may be separated by the first separation trench 210t. The short side B5' of the fifth active pattern AP5 and the short side B6 of the sixth active pattern AP6 may be defined by the first separation trench 210t.

In an implementation, a width W2 of the second separation trench 215t in the first direction X (e.g., as measured at a level of the first gate structure GS1 and the second gate structure GS2) may be greater than the width W1 of the first separation trench 210t in the first direction X (e.g., as measured at the level of the first gate structure GS1 and the second gate structure GS2).

Each of the first through sixth active patterns AP1 through AP6 may be a part of the substrate 100 or may include an epitaxial layer grown from the substrate 100. Each of the first through sixth active patterns AP1 through AP6 may include silicon or germanium which is an elemental semiconductor material. In an implementation, each of the first through sixth active patterns AP1 through AP6 may include a compound semiconductor such as a group IV-IV compound semiconductor or a group III-V compound semiconductor.

The field insulating layer 110 may be on the substrate 100. The field insulating layer 110 may fill at least a part of each of the fin trench FT and the fin cut trench FCT. In an implementation, the field insulating layer 110 may be between the first and second active patterns AP1 and AP2.

The field insulating layer 110 may be on a part of sidewalls of each of the first through sixth active patterns AP1 through AP6. In an implementation, the field insulating layer 110 may be on a part of a sidewall of the short side B1 or B2 of each of the first and second active patterns AP1 and AP2.

Upper surfaces (e.g., surfaces facing away from the substrate 100 in the third direction Z) of the first through sixth active patterns AP1 through AP6 may protrude above (e.g., farther from the substrate 100 in the third direction Z than) an upper surface of the field insulating layer 110. The field insulating layer 110 may include, e.g., a silicon oxide layer, a silicon nitride layer, or a silicon oxynitride layer. In the semiconductor device according to the embodiments of the present disclosure, the field insulating layer 110 may fill a part of the fin cut trench FCT.

The first through fifth gate structures GS1 through GS5 may be on the active patterns AP1 through AP6 and the field insulating layer 110 and may extend in the second direction Y. In an implementation, each of the first through fifth gate structures GS1 through GS5 may include long sides extending in the second direction Y and short sides extending in the first direction X.

The first gate structure GS1 may be on the first active pattern AP1 and the fourth active pattern AP4 to intersect the first active pattern AP1 and the fourth active pattern AP4. The first gate structure GS1 may overlap an end of the first active pattern AP1 including the short side B1 of the first active pattern AP1. A part of the first gate structure GS1 may extend along the upper surface of the first active pattern AP1. In addition, a part of the first gate structure GS1 may extend along the upper surface of the field insulating layer 110.

The second gate structure GS2 may be on the second active pattern AP2 and the fifth active pattern AP5 to intersect the second active pattern AP2 and the fifth active pattern AP5. The second gate structure GS2 may overlap an end of the second active pattern AP2 including the short side B2 of the second active pattern AP2. A part of the second gate structure GS2 may extend along the upper surface of the second active pattern AP2. In addition, a part of the second gate structure GS2 may extend along the upper surface of the field insulating layer 110.

The third gate structure GS3 may be on the first active pattern AP1 and the fourth active pattern AP4 to intersect the first active pattern AP1 and the fourth active pattern AP4. The fourth gate structure GS4 may be on the second active pattern AP2 and the fifth active pattern AP5 to intersect the second active pattern AP2 and the fifth active pattern AP5. The fifth gate structure GS5 may be on the third active pattern AP3 and the sixth active pattern AP6 to intersect the third active pattern AP3 and the sixth active pattern AP6. The third through fifth gate structures GS3 through GS5 may not overlap ends of the first through sixth active patterns AP1 through AP6.

In the semiconductor device according to the embodiments of the present disclosure, the first gate structure GS1 may cover the end of the first active pattern AP1, and the second gate structure GS2 may cover the end of the second active pattern AP2. The first gate structure GS1 may cover the sidewall of the first active pattern AP1 which defines the short side B1 of the first active pattern AP1. The second gate structure GS2 may cover the sidewall of the second active pattern AP2 which defines the short side B2 of the second active pattern AP2.

The first through fifth gate structures GS1 through GS5 may include gate insulating layers 120 through 520, gate electrodes 130 through 530, gate spacers 140 through 540, gate trenches 140t through 540t defined by the gate spacers 140 through 540, and capping patterns 155 through 555, respectively.

The first through fifth gate insulating layers 120 through 520 may be between the first through sixth active patterns AP1 through AP6 and the gate electrodes 130 through 530, respectively. The first through fifth gate insulating layers 120 through 520 may extend along sidewalls and bottom surfaces of the gate trenches 140t through 540t, respectively.

The first through fifth gate insulating layers 120 through 520 may include, e.g., a high dielectric constant (high-k) insulating layer. The high-k insulating layer may include a high-k material having a higher dielectric constant than a silicon oxide layer.

The first through fifth gate electrodes 130 through 530 may be on the gate insulating layers 120 through 520, respectively. The first through fifth gate electrodes 130 through 530 may at least partially fill the gate trenches 140t through 540t, respectively.

The first through fifth gate electrodes 130 through 530 may include e.g., Ti, Ta, W, Al, Co, or combinations of the same. In an implementation, the first through fifth gate electrodes 130 through 530 may be made of silicon or silicon germanium.

The first through fifth gate spacers 140 through 540 may be on sidewalls of the first through fifth gate electrodes 130 through 530, respectively.

The first through fifth gate spacers 140 through 540 may include, e.g., silicon nitride (SiN), silicon oxynitride (SiON), silicon oxide (SiO$_2$), or silicon oxycarbonitride (SiOCN).

The first through fifth capping patterns 155 through 555 may extend along upper surfaces of the first through fifth gate spacers 140 through 540, highest surfaces of the first through fifth gate insulating layers 120 through 520, and upper surfaces of the first through fifth gate electrodes 130 through 530, respectively.

In an implementation, the first through fifth spacers 140 through 540 may also be on the sidewalls of the first through fifth gate electrodes 130 through 530 and sidewalls of the first through fifth capping patterns 155 through 555, respectively.

The first through fifth capping patterns 155 through 555 may include, e.g., silicon oxide (SiO$_2$), silicon nitride (SiN), silicon oxynitride (SiON), silicon cabonitride (SiCN), or silicon oxycarbonitride (SiOCN).

In an implementation, some of the first through fifth capping patterns 155 through 555 may be omitted.

First source/drain regions 150 may be on the first active pattern AP1. In an implementation, a first source/drain region 150 may be on the first active pattern AP1 between the first gate structure GS1 and the third gate structure GS3. Second source/drain regions 160 may be on the second active pattern AP2. Third source/drain regions 170 may be on the third active pattern AP3. Fourth source/drain regions 180 may be on the fourth active pattern AP4. Fifth source/drain regions 190 may be on the fifth active pattern AP5. Sixth source/drain regions 200 may be on the sixth active pattern AP6.

The first through sixth source/drain regions 150 through 200 may be included in source/drain regions of transistors using the first through sixth active patterns AP1 through AP6 as channel regions, respectively.

The first element isolation layer 210 may be between the second active pattern AP2 and the third active pattern AP3. The first element isolation layer 210 may be between the short side B2 of the second active pattern AP2 and the short side B3 of the third active pattern AP3. The first element isolation layer 210 may separate the second active pattern AP2 and the third active pattern AP3. The first element isolation layer 210 may be between the fourth gate structure GS4 and the fifth gate structure GS5.

The first interlayer insulating film 191 may be on the field insulating layer 110 and the first through sixth source/drain regions 150 through 200. The first interlayer insulating film 191 may cover sidewalls of the first through fifth gate structures GS1 through GS5. An upper surface (e.g., surface facing away from the substrate 100 in the third direction Z) of the first interlayer insulating film 191 may lie in substantially the same plane as (e.g., may be coplanar with) upper surfaces of the first through fifth capping patterns 155 through 555.

In an implementation, the first interlayer insulating film 191 may further include an etch stop layer extending along upper surfaces of the first through sixth source/drain regions 150 through 200.

The first element isolation layer 210 may be in the first separation trench 210t in the field insulating layer 110. The first element isolation layer 210 may fill the first separation trench 210t. The first separation trench 210t may be between a fifth source/drain region 190 and a sixth source/drain region 200. The first separation trench 210t may extend in the second direction Y. In addition, the first element isolation layer 210 may extend in the second direction Y.

An upper surface of the first element isolation layer 210 may be higher than the upper surfaces of the second and third active patterns AP2 and AP3 (e.g., the upper surface of the first element isolation layer 210 may be farther from the substrate 100 in the third direction Z than the upper surfaces of the second and third active patterns AP2 and AP3 are to the substrate 100). In an implementation, the upper surface of the first element isolation layer 210 may lie in substantially the same plane as the upper surface of the first interlayer insulating film 191. The upper surface of the first element isolation layer 210 may lie in substantially the same plane as upper surfaces of the first through fifth gate structures GS1 through GS5. As used herein, the term "same" is intended to encompass not only exactly the same but also a minute difference caused by a process margin or the like.

In an implementation, the upper surface of the first element isolation layer 210 may be higher than the upper surface of the first interlayer insulating film 191 and lower than (e.g., closer to the substrate 100 in the third direction Z than) an upper surface of the second interlayer insulating film 192. In an implementation, the upper surface of the first element isolation layer 210 may be in the second interlayer insulating film 192.

In an implementation, as illustrated in the drawings, a width between sidewalls of the first separation trench 210t defined by the second and third active patterns AP2 and AP3 may increase as the distance from the substrate 100 increases in the third direction Z.

A bottom surface (e.g., substrate 100-facing surface) of the first separation trench 210t may be defined by the field insulating layer 110, the substrate 100, and the remaining active pattern. The remaining active pattern may be a part remaining after a part of an active pattern is removed in an etching process for forming the first separation trench 210t. In an implementation, when there is no remaining active pattern, the bottom surface of the first separation trench 210t may be defined by the field insulating layer 110 and the substrate 100.

The sidewalls of the first separation trench 210t may be defined by dummy spacers 40, dummy capping patterns 55, the field insulating layer 110, the second active pattern AP2, and the third active pattern AP3. The first separation trench 210t may separate the second active pattern AP2 and the third active pattern AP3 in the first direction X.

The dummy spacers 40 may include a same material as the gate spacers 140 through 540. In an implementation, the dummy spacers 40 may not be on sidewalls of the first element isolation layer 210.

The dummy capping patterns 55 may be on the dummy spacers 40. The first element isolation layer 210 may be recessed into the dummy capping patterns 55. A surface where each dummy capping pattern 55 and the first element isolation layer 210 contact each other may form a curve. In an implementation, the surface where each dummy capping pattern 55 and the first element isolation layer 210 contact each other may form an inclined surface.

In an implementation, the dummy capping patterns 55 may not be on the sidewalls of the first element isolation layer 210, and the first element isolation layer 210 may cover the dummy spacers 40. The dummy capping patterns 55 may include the same material as the capping patterns 155 through 555.

A distance D1 from the upper surface of the first interlayer insulating film 191 to a lowest surface of the first element isolation layer 210 (e.g., surface proximate to the substrate 100) may be smaller than a distance D0 from the upper surface of the first interlayer insulating film 191 to a lower surface of the fin cut trench FCT. In an implementation, the lowest surface of the first element isolation layer 210 may be higher than a bottom surface of the fin cut trench FCT. In an implementation, the distance D1 from a highest surface of the first element isolation layer 210 to the lowest surface of the first element isolation layer 210, e.g., a depth of the first element isolation layer 210 in the third direction Z, may be smaller than the distance D0 from the upper surface of the first interlayer insulating film 191 to the lower surface of the fin cut trench FCT.

The first element isolation layer 210 may include, e.g., silicon nitride, silicon oxide, silicon carbide, silicon carbonitride, silicon oxycarbide, silicon oxynitride, silicon oxycarbonitride, or aluminum oxide. In an implementation, as illustrated in drawings, the first element isolation layer 210 may be a single layer.

The second element isolation layer 215 may be between the fourth active pattern AP4 and the fifth active pattern AP5. The second element isolation layer 215 may be between the short side B4 of the fourth active pattern AP4 and the short side B5 of the fifth active pattern AP5. The second element isolation layer 215 may separate the fourth active pattern AP4 and the fifth active pattern AP5. The second element isolation layer 215 may be between the first gate structure GS1 and the second gate structure GS2.

The second element isolation layer 215 may fill the second separation trench 215t. The second separation trench 215t may be formed between the first gate structure GS1 and the second gate structure GS2. The second separation trench 215t may extend in the second direction Y. The second element isolation layer 215 may extend in the second direction Y.

An upper surface of the second element isolation layer 215 may be higher than the upper surfaces of the fourth and fifth active patterns AP4 and AP5. In an implementation, as illustrated in the drawings, the upper surface of the second element isolation layer 215 may lie in substantially the same plane as the upper surface of the first interlayer insulating film 191. The upper surface of the second element isolation layer 215 may lie in substantially the same plane as the upper surfaces of the first through fifth gate structures GS1 through GS5.

In an implementation, the upper surface of the second element isolation layer 215 may be higher than the upper surface of the first interlayer insulating film 191 and lower than the upper surface of the second interlayer insulating film 192. In an implementation, the upper surface of the second element isolation layer 215 may be in the second interlayer insulating film 192.

In an implementation, as illustrated in the drawings, a width between sidewalls of the second separation trench 215t defined by the fourth and fifth active patterns AP4 and AP5 may increase as the distance from the substrate 100 increases (e.g., in the third direction Z).

The sidewalls of the second separation trench 215t may be defined by the sidewalls of the first gate structure GS1, the second gate structure GS2, the fourth active pattern AP4, and the fifth active pattern AP5. The second separation trench 215t may expose (e.g., be open to) at least a part of the upper surface of the first gate structure GS1 or the second gate structure GS2. In an implementation, the second separation trench 215t may expose a part of the upper surface of the first capping pattern 155 or the whole of the first capping pattern 155 and may expose a part of the upper surface of the second capping pattern 255 or the whole of the second capping pattern 255.

The second element isolation layer 215 may be recessed into the first capping pattern 155 and the second capping pattern 255. The second element isolation layer 215 may cover the exposed upper surface of the first capping pattern 155 and the exposed upper surface of the second capping pattern 255. In an implementation, the second element isolation layer 215 may cover all of the upper surfaces of the first and second gate electrodes 130 and 230, the first and second gate insulating layers 120 and 220, and the first and second gate spacers 140 and 240.

In an implementation, as illustrated in the drawings, the first capping pattern 155 of the first gate structure GS1 and the second capping pattern 255 of the second gate structure GS2 may be partially removed. In an implementation, the first capping pattern 155 and the second capping pattern 255 may also be entirely removed.

A surface where the second element isolation layer 215 contacts the first capping pattern 155 or the second capping pattern 255 may form a curve (e.g., may be a curved surface). In an implementation, the surface where the second element isolation layer 215 contacts the first capping pattern 155 and/or the second capping pattern 255 may form an inclined surface.

In an implementation, the second separation trench 215t may partially expose a first gate spacer 140 and a second gate spacer 240 facing the second element isolation layer 215. In an implementation, the second separation trench 215t may expose a part of an upper part of the first gate spacer 140 and a part of an upper part of the second gate spacer 240.

A distance D2 from the upper surface of the first interlayer insulating film 191 to a lowest surface of the second element isolation layer 215 may be greater than the distance D1 from the upper surface of the first interlayer insulating film 191 to the lowest surface of the first element isolation layer 210. In an implementation, the lowest surface of the second element isolation layer 215 may be lower than (e.g., closer to the substrate 100 in the third direction Z than) the lowest surface of the first element isolation layer 210. In an implementation, the distance D2 from a highest surface of the second element isolation layer 215 to the lowest surface of the second element isolation layer 215, e.g., a depth of the second element isolation layer 215 in the third direction Z, may be greater than the depth D1 of the first element isolation layer 210 in the third direction Z.

The first separation trench 210t may be adjacent to a second source/drain region 160 and a third source/drain region 170 or adjacent to a fifth source/drain region 190 and a sixth source/drain region 200. The first separation trench 210t may be etched in the first direction X and the third direction Z, and the source/drain regions 160, 170, 190 and 200 adjacent to the first separation trench 210t may be more likely to be damaged as the depth of the first separation trench 210t increases. The second separation trench 215t may be etched between the first gate structure GS1 and the second gate structure GS2, and it may be spaced apart from the fourth source/drain region 180 and the fifth source/drain region 190 in the first direction X. Therefore, the depth D1 of the first separation trench 210t may be smaller than the depth D2 of the second separation trench 215t.

The second element isolation layer 215 may include, e.g., silicon nitride, silicon oxide, silicon carbide, silicon carbonitride, silicon oxycarbide, silicon oxynitride, silicon oxycarbonitride, or aluminum oxide. In an implementation, the second element isolation layer 215 may be a single layer.

The second interlayer insulating film 192 may be on the first interlayer insulating film 191. The second interlayer insulating film 192 may cover the first through fifth gate structures GS1 through GS5 and the first and second element isolation layers 210 and 215. The second interlayer insulating film 192 may include, e.g., silicon oxide, silicon nitride, or silicon oxynitride.

Contacts 195 may penetrate the first interlayer insulating film 191 and the second interlayer insulating film 192 and may be connected to the first through sixth source/drain regions 150 through 200. In an implementation, as illustrated in the drawings, the contacts 195 may not contact the first through fifth gate structures GS1 through GS5. In an implementation, the contacts 195 may contact the sidewalls of the first through fifth gate structures GS1 through GS5. The contacts 195 may be formed by, e.g., a self-aligned contact (SAC) process.

Upper surfaces of the contacts 195 may be higher than the upper surfaces of the first element isolation layer 210 and the second element isolation layer 215. The upper surfaces of the contacts 195 may lie in the same plane as the upper surface of the second interlayer insulating film 192.

In an implementation, as illustrated in the drawings, each of the contacts 195 may include a single structure. In an implementation, each of the contacts 195 may also include a plurality of structures arranged in a thickness direction of the substrate 100. In an implementation, a silicide layer may also be formed between the contacts 195 and the first and second source/drain regions 150 and 160.

The contacts 195 may include, e.g., tantalum (Ta), tantalum nitride (TaN), titanium (Ti), titanium nitride (TiN), tungsten nitride (WN), tungsten carbonitride (WCN), tungsten (W), cobalt (Co), ruthenium (Ru), molybdenum (Mo), nickel (Ni), aluminum (Al), copper (Cu), doped polysilicon, or combinations of the same.

A third interlayer insulating film 193 may be on the contacts 195 and the second interlayer insulating film 192. The third interlayer insulating film 193 may include, e.g., silicon oxide, silicon nitride, or silicon oxynitride.

Wiring structures 185 may be in the third interlayer insulating film 193. The wiring structures 185 may be formed in a back-end-of-line (BEOL) process. The wiring structures 185 may be connected to the contacts 195. Each of the wiring structures 185 may include a via pattern 181 and a wiring pattern 182. In an implementation, as illustrated in the drawings, each of the wiring structures 185 may be a single layer.

Figure 5:
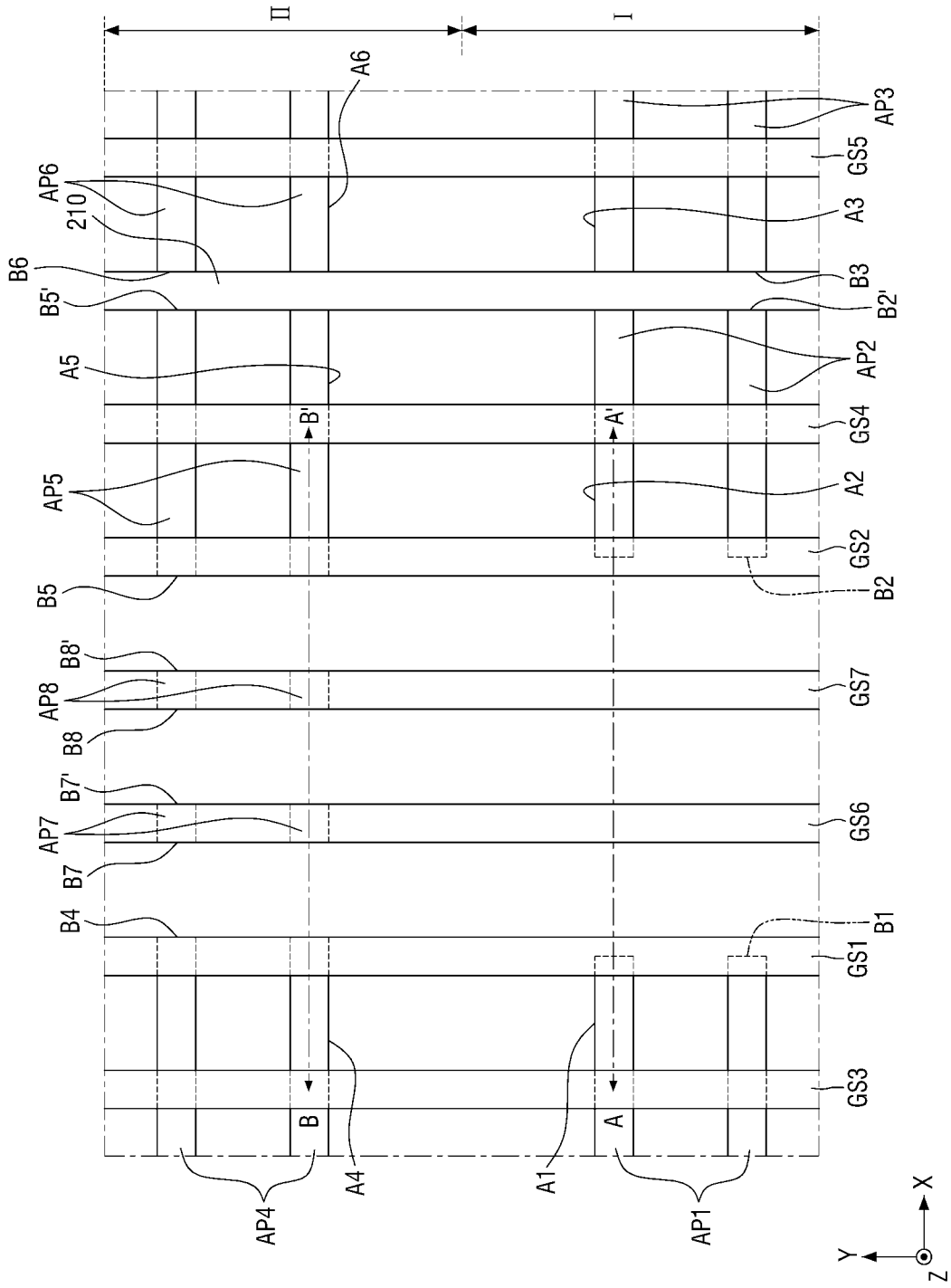
FIG. 5 illustrates a schematic layout view of a semiconductor device according to some embodiments of the present disclosure.
Figure 6:
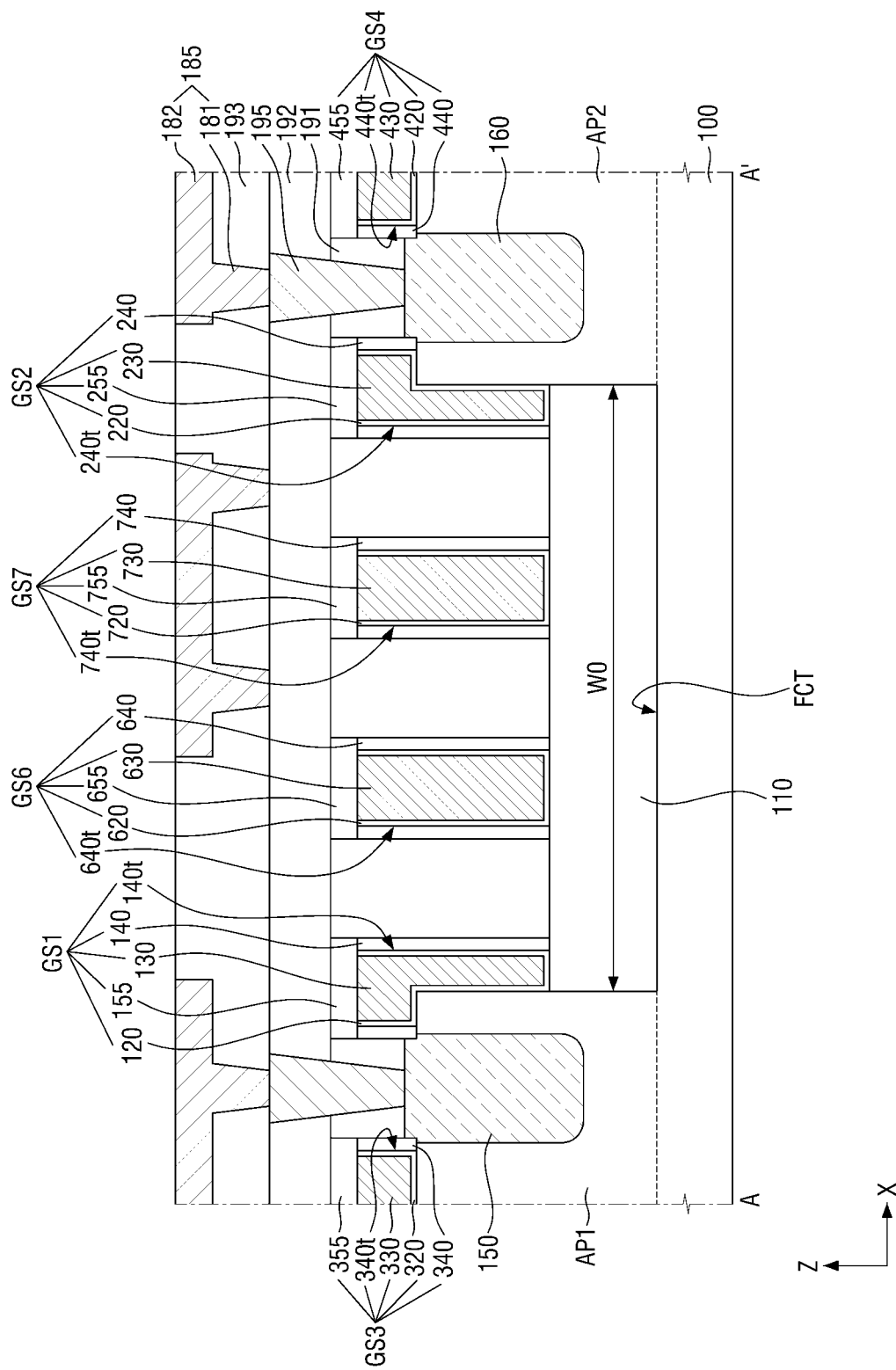
FIG. 6 illustrates a cross-sectional view taken along line A-A' of FIG. 5.
Figure 7:
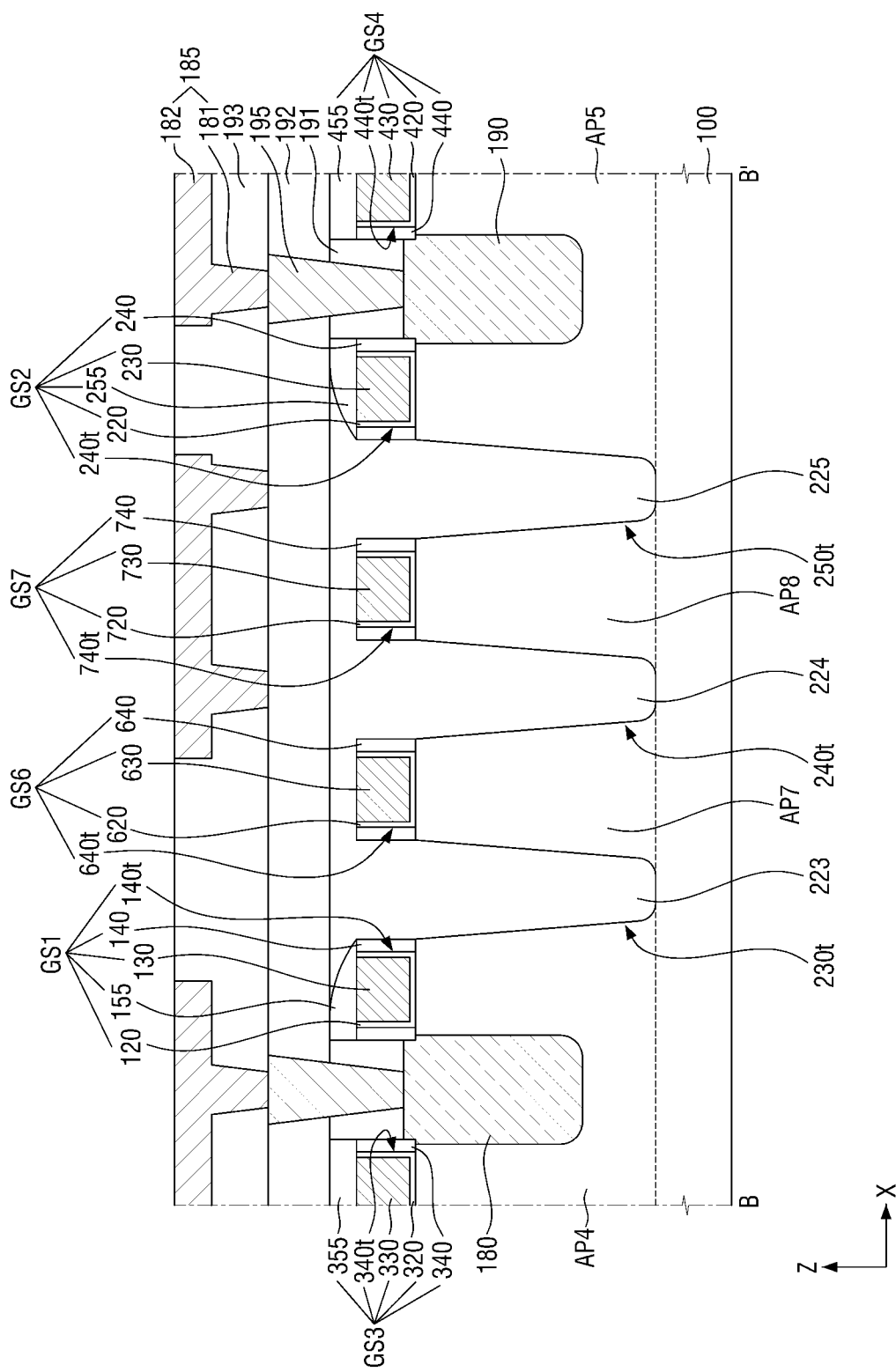
FIG. 7 illustrates a cross-sectional view taken along line B-B' of FIG. 5.

FIG. 5 is a schematic layout view of a semiconductor device according to embodiments of the present disclosure. FIG. 6 is a cross-sectional view taken along line A-A' of FIG. 5. FIG. 7 is a cross-sectional view taken along line B-B' of FIG. 5. For ease of description, a repeated description of the same elements and features as those described using FIGS. 1 through 4 will be given briefly or omitted.

Referring to FIGS. 5 through 8, the semiconductor device according to the embodiments of the present disclosure may further include a seventh active pattern AP7, an eighth active pattern AP5, a sixth gate structure GS6, and a seventh gate structure GS7.

The seventh active pattern AP7 and the eighth active pattern AP8 may be on a second area II of a substrate 100. The seventh active pattern AP7 and the eighth active pattern AP5 may extend in the first direction X between a fourth active pattern AP4 and a fifth active pattern AP5 and may be spaced apart from each other in the first direction X.

A short side B7 of the seventh active pattern AP7 may face a short side B4 of the fourth active pattern AP4. The seventh active pattern AP7 and the fourth active pattern AP4 may be separated by a third separation trench 230*t*. The short side B7 of the seventh active pattern AP7 and the short side B4 of the fourth active pattern AP4 may be defined by the third separation trench 230*t*.

A short side B8 of the eighth active pattern AP8 may face a short side B7' of the seventh active pattern AP7. The eighth active pattern AP8 and the seventh active pattern AP7 may be separated by a fourth separation trench 240*t*. The short side B8 of the eighth active pattern AP8 and the short side B7' of the seventh active pattern AP7 may be defined by the fourth separation trench 240*t*.

A short side B8' of the eighth active pattern AP8 may face a short side B5 of the fifth active pattern AP5. The eighth active pattern AP8 and the fifth active pattern AP5 may be separated by a fifth separation trench 250*t*. The short side B8' of the eighth active pattern AP8 and the short side B5 of the fifth active pattern AP5 may be defined by the fifth separation trench 250*t*.

In an implementation, a width of the third separation trench 230*t* in the first direction X may be substantially equal to a width of the fourth separation trench 240*t* in the first direction X and a width of the fifth separation trench 250*t* in the first direction X. In an implementation, a depth of the third separation trench 230*t* in the third direction Z may be substantially equal to a depth of the fourth separation trench 240*t* in the third direction Z and a depth of the fifth separation trench 250*t* in the third direction Z.

Sidewalls of the third separation trench 230*t* may be defined (e.g., partially defined) by sidewalls of a first gate structure GS1 and the sixth gate structure GS6. Sidewalk of the fourth separation trench 240*t* may be defined (e.g., partially defined) by sidewalls of the sixth gate structure GS6 and the seventh gate structure GS7. Sidewalls of the fifth separation trench 250*t* may be defined (e.g., partially defined) by sidewalls of the seventh gate structure GS7 and a second gate structure GS2. Upper parts of the third through fifth separation trenches 230*t* through 250*t* may be connected to each other.

The sixth and seventh gate structures GS6 and GS7 may be on the active patterns AP7 and AP8 and a field insulating layer 110 and may extend in the second direction Y. In an implementation, each of the sixth and seventh gate structures GS6 and GS7 may include long sides extending in the second direction Y and short sides extending in the first direction X.

The sixth gate structure GS6 may be on the seventh active pattern AP7 to intersect the seventh active pattern AP7. The seventh gate structure GS7 may be on the eighth active pattern AP8 to intersect the eighth active pattern AP8.

The sixth and seventh gate structures GS6 and GS7 may include gate insulating layers 620 and 720, gate electrodes 630 and 730, gate spacers 640 and 740, gate trenches 640*t* and 740*t* defined by the gate spacers 640 and 740, and capping patterns 655 and 755, respectively.

The sixth and seventh gate insulating layers 620 and 720 may be between the seventh and eighth active patterns AP7 and AP8 and the gate electrodes 630 and 730, respectively. The sixth and seventh gate insulating layers 620 and 720 may extend along sidewall s and bottom surfaces of the gate trenches 640*t* and 740*t*, respectively.

The third separation trench 230*t* may expose at least a part of an upper surface of the first gate structure GS1. The third separation trench 230*t* may expose at least a part of a first capping pattern 155. The fifth separation trench 250*t* may expose at least a part of an upper surface of the second gate structure GS2. The fifth separation trench 250*t* may expose at least a part of a second capping pattern 255.

The third through fifth separation trenches 230t through 250t may be connected to each other at a position where the capping patterns 155, 255, 655 and 755 are disposed. The third through fifth separation trenches 230t through 250t may expose upper surfaces of the sixth and seventh gate electrodes 630 and 730, the sixth and seventh gate insulating layers 620 and 720, and the sixth and seventh gate spacers 640 and 740.

The third through fifth element isolation layers 223 through 225 may fill the third through fifth separation trenches 230t through 250t, respectively. The third through fifth element isolation layers 223 through 225 may cover upper surfaces of the first, second, sixth and seventh gate structures GS1, GS2, GS6 and GS7. Upper surfaces of the third through fifth element isolation layers 223 through 225 may lie in substantially the same plane as upper surfaces of third and fourth gate structures GS3 and GS4. In an implementation, the upper surfaces of the third through fifth element isolation layers 223 through 225 may be higher than an upper surface of a first interlayer insulating film 191 and lower than an upper surface of a second interlayer insulating film 192. In an implementation, the upper surfaces of the third through fifth element isolation layers 223 through 225 may be in the second interlayer insulating film 192.

The third through fifth element isolation layers 223 through 225 may be connected to each other. The third element isolation layer 223 and the fourth element isolation layer 224 may be connected to each other on or over the upper surface of the sixth gate structure GS6. The fourth element isolation layer 224 and the fifth element isolation layer 225 may be connected to each other on or over the upper surface of the seventh gate structure GS7. This may result from an etching process for forming the third through fifth separation trenches 230t through 250t.

In an implementation, as illustrated in the drawings, the sixth capping pattern 655 of the sixth gate structure GS6 and the seventh capping pattern 755 of the seventh gate structure GS7 may be entirely removed. In an implementation, a part of each of the sixth capping pattern 655 and the seventh capping pattern 755? may remain.

In an implementation, as illustrated in the drawings, the sixth gate structure GS6 and the seventh gate structure GS7 may be between the first gate structure GS1 and the second gate structure GS2. In an implementation, three or more gate structures may also be between the first gate structure GS1 and the second gate structure GS2.

Figure 8:
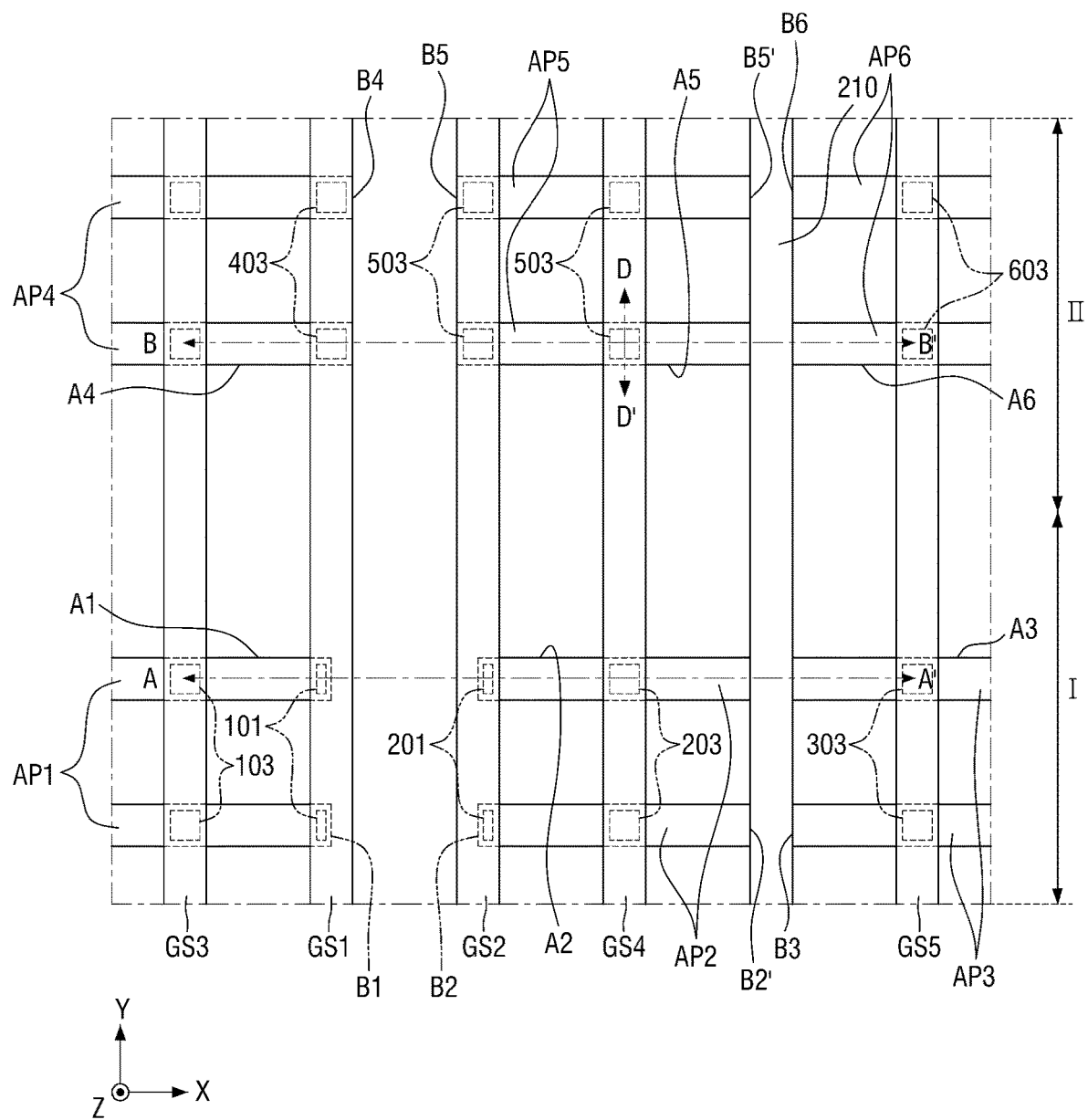
FIG. 8 illustrates a schematic layout view of a semiconductor device according to some embodiments of the present disclosure.
Figure 9:
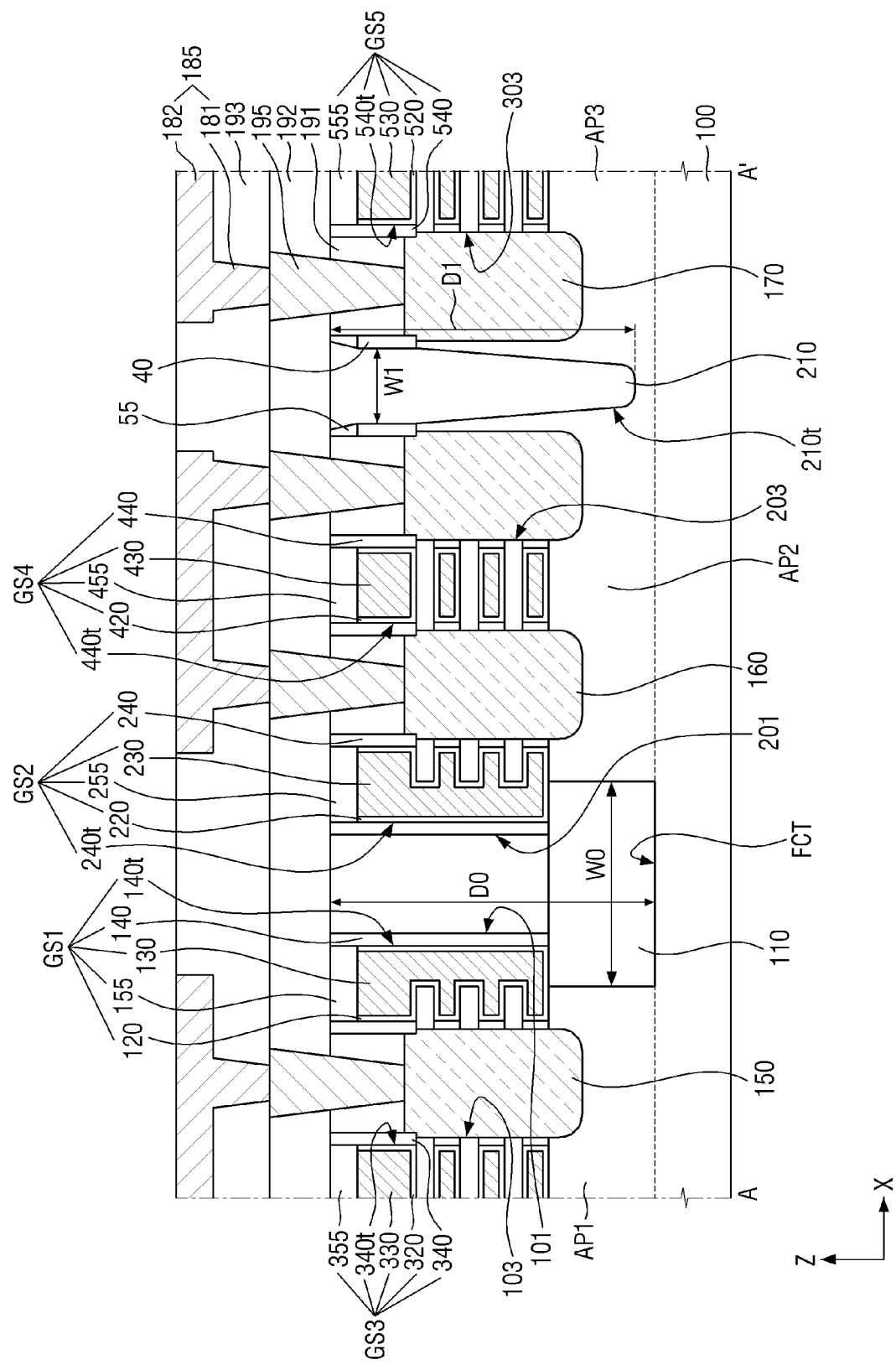
FIG. 9 illustrates a cross-sectional view taken along line A-A' of FIG. 8.
Figure 10:
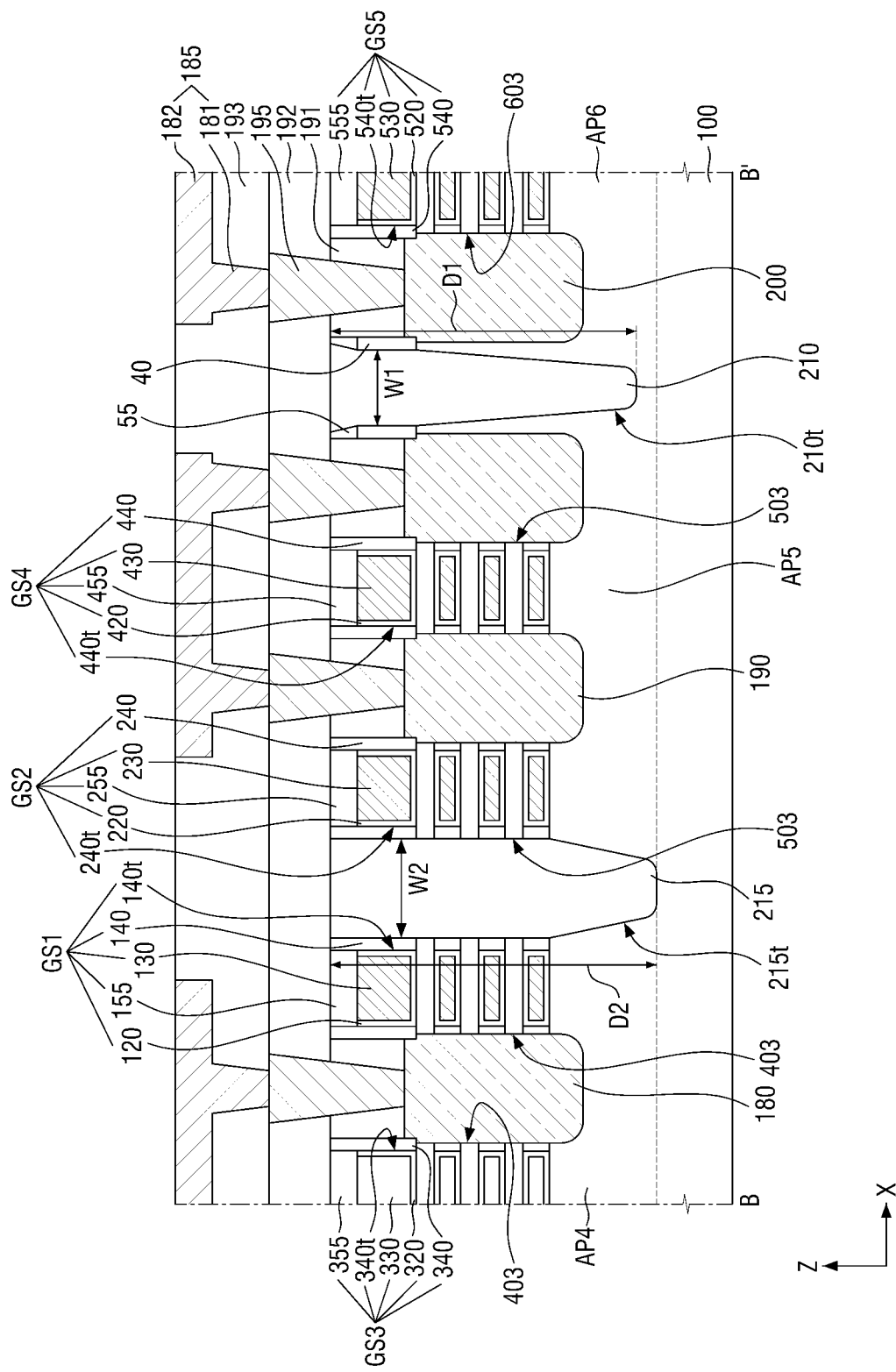
FIG. 10 illustrates a cross-sectional view taken along line B-B' of FIG. 8.
Figure 11:
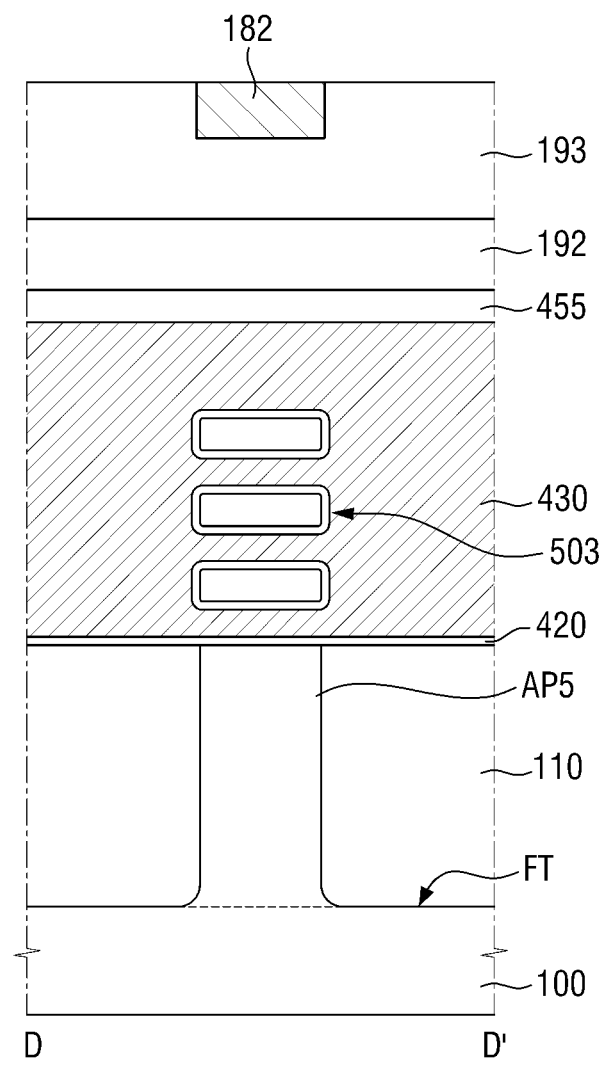
FIG. 11 illustrates a cross-sectional view taken along line D-D' of FIG. 8.

FIG. 8 is a schematic layout view of a semiconductor device according to embodiments of the present disclosure. FIG. 9 is a cross-sectional view taken along line A-A' of FIG. 8. FIG. 10 is a cross-sectional view taken along line B-B' of FIG. 8. FIG. 11 is a cross-sectional view taken along line D-D' of FIG. 8. For ease of description, a repeated description of the same elements and features as those described using FIGS. 1 through 4 will be given briefly or omitted.

First through sixth active patterns AP1 through AP6 may further include wire patterns 103 through 603 and fin cut wire patterns 101 and 201.

A first wire pattern 103 and a first fin cut pattern 101 may be on the first active pattern AP1 and spaced apart from the first active pattern AP1 in the third direction Z. Each of the first wire pattern 103 and the first fin cut wire pattern 101 may be provided in plural numbers, and the first wire patterns 103 and the first fin cut patterns 101 may be spaced apart and stacked in the third direction Z.

The first wire patterns 103 may be connected to first source/drain regions 150 on both sides in the first direction X. The first fin cut wire patterns 101 may be connected to one first source/drain region 150. The first fin cut wire patterns 101 may be at an end of the first active pattern AP1 defined by a fin cut trench FCT.

A second wire pattern 203 and a second fin cut wire pattern 201 may be on the second active pattern AP2 and spaced apart from the second active pattern AP2 in the third direction Z. Each of the second wire pattern 203 and the second fin cut wire pattern 201 may be provided in plural numbers, and the second wire patterns 203 and the second fin cut patterns 201 may be spaced apart and stacked in the third direction Z.

The second wire patterns 203 may be connected to second source/drain regions 160 on both sides in the first direction X. The second fin cut wire patterns 201 may be connected to one second source/drain region 160. The second fin cut wire patterns 201 may be at an end of the second active pattern AP2 defined by the fin cut trench FCT.

A third wire pattern 303 may be on the third active pattern AP3 and spaced apart from the third active pattern AP3 in the third direction Z. The third wire pattern 303 may be provided in plural numbers, and the third wire patterns 303 may be spaced apart and stacked in the third direction Z. The third wire patterns 303 may be connected to third source/drain regions 170 on both sides in the first direction X.

A fourth wire pattern 403 may be on the fourth active pattern AP4 and spaced apart from the fourth active pattern AP4 in the third direction Z. The fourth wire pattern 403 may be provided in plural numbers, and the fourth wire patterns 403 may be spaced apart and stacked in the third direction Z. The fourth wire patterns 403 may be connected to fourth source/drain regions 180 on both sides in the first direction X.

A fifth wire pattern 503 may be on the fifth active pattern AP5 and spaced apart from the fifth active pattern AP5 in the third direction Z. The fifth wire pattern 503 may be provided in plural numbers, and the fifth wire patterns 503 may be spaced apart and stacked in the third direction Z. The fifth wire patterns 503 may be connected to fifth source/drain regions 190 on both sides in the first direction X.

A sixth wire pattern 603 may be on the sixth active pattern AP6 and spaced apart from the sixth active pattern AP6 in the third direction Z. The sixth wire pattern 603 may be provided in plural numbers, and the sixth wire patterns 603 may be spaced apart and stacked in the third direction Z. The sixth wire patterns 603 may be connected to sixth source/drain regions 200 on both sides in the first direction X.

Each of the first through sixth wire patterns 103 through 603 and the first and second fin cut wire patterns 101 and 201 may include silicon or germanium, which is an elemental semiconductor material or may include a compound semiconductor such as a group IV-IV compound semiconductor or a group III-V compound semiconductor.

The first through sixth wire patterns 103 through 603 may be used, e.g., as channel regions of transistors having the same conductivity type.

Respective bottom surfaces of the first through sixth wire patterns 103 through 603 and the first and second fin cut wire patterns 101 and 201 may be higher than bottom surfaces of the first through sixth source/drain regions 150 through 200.

A first gate structure GS1 may cover the first fin cut wire patterns 101. The first gate structure GS1 may entirely cover the end of the first active pattern AP1. In an implementation, the first gate structure GS1 may cover the fourth wire patterns 403.

A second gate structure GS2 may cover the second fin cut wire patterns 201. The second gate structure GS2 may entirely cover the end of the second active pattern AP2. In an implementation, the second gate structure GS2 may cover the fifth wire patterns 503.

A third gate structure GS3 may cover the first wire patterns 103 and the fourth wire patterns 403. A fourth gate structure GS4 may cover the second wire patterns 203 and the fifth wire patterns 503. A fifth gate structure GS5 may cover the third wire patterns 303 and the sixth wire patterns 603.

In an implementation, as illustrated in the drawings, three of the first through sixth wire patterns 103 through 603 and the first and second fin cut wire patterns 101 may be present.

Sidewalls of a second separation trench 215t may be defined by sidewalls of the first gate structure GS1, the second gate structure GS2, the fourth active pattern AP4, the fifth active pattern AP5, the first fin cut wire patterns 101, and the second fin cut wire patterns 201.

A second element isolation layer 215 may fill the second separation trench 215t. A width of the second element isolation layer 215 in the first direction X may be equal to a distance between facing sidewalls of the fourth and fifth fin cut wire patterns 403 and 503. In an implementation, the width of the second element isolation layer 215 in the first direction X may be equal to a distance between a first gate spacer 140 and a second gate spacer 240 facing each other.

FIGS. 12 through 17 illustrate stages in a method of manufacturing a semiconductor device according to embodiments of the present disclosure. For ease of description, a repeated description of the same elements and features as those described using FIGS. 1 through 4 will be given briefly or omitted.

Figure 12:
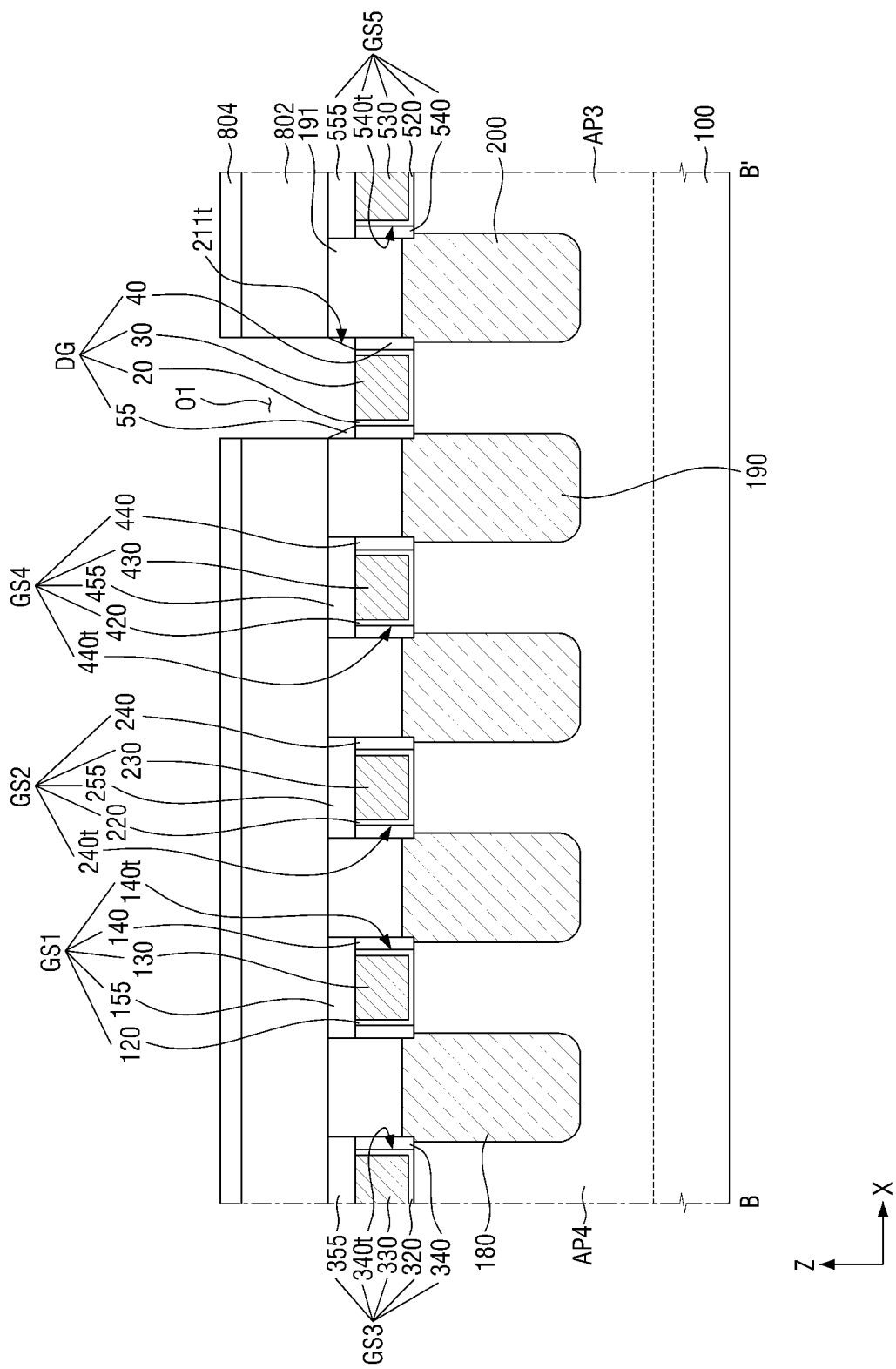
FIGS. 12 through 17 illustrate stages in a method of manufacturing a semiconductor device according to some embodiments of the present disclosure.

Referring to FIG. 12, a fourth active pattern AP4, fourth through sixth source/drain regions 180 through 200, a plurality of gate structures GS1 through GS5, and a dummy gate structure DG may be formed on a substrate 100. The gate structures GS1 through GS5 may include gate insulating layers 120 through 520, gate electrodes 130 through 530, gate spacers 140 through 540, and capping patterns 155 through 555, respectively. The dummy gate structure DG may include a dummy gate insulating layer 20, a dummy gate electrode 30, dummy spacers 40, and a dummy capping pattern 55.

The fourth active pattern AP4 may be formed to protrude from the substrate 100. For example, the fourth active pattern AP4 may extend in the first direction X. The fourth active pattern AP4 may be a part of the substrate 100 or may include an epitaxial layer grown from the substrate 100.

The fourth through sixth source/drain regions 180 through 200 may be formed in the fourth active pattern AP4. In an implementation, the fourth through sixth source/drain regions 180 through 200 may be formed by, e.g., an epitaxial growth process.

A first interlayer insulating film 191 may be formed on the fourth through sixth source/drain regions 180 through 200, the gate structures GS1 through GS5, and the dummy gate structure DG. Upper surfaces of the first interlayer insulating film 191, the gate structures GS1 through GS5, and the dummy gate structure DG may be made to lie in the same plane by a planarization process.

A sub-insulating layer 802 may be formed on the first interlayer insulating film 191, the gate structures GS1 through GS5, and the dummy gate structure DG. A first mask pattern 804 including a first opening O1 may be formed on the sub-insulating layer 802. The first opening O1 may expose the sub-insulating layer 802 on the dummy gate structure DG. The first opening O1 may extend lengthwise, e.g., in the second direction Y (see FIG. 1).

The dummy gate structure DG may be etched using the first mask pattern 804 as an etch mask. Accordingly, the dummy capping pattern 55 may be etched to form a first sub-trench 211t. The dummy gate electrode 30, the dummy gate insulating layer 20, and the dummy spacers 40 may be partially exposed by the first sub-trench 211t. Then, the first mask pattern 804 may be removed.

Figure 13:
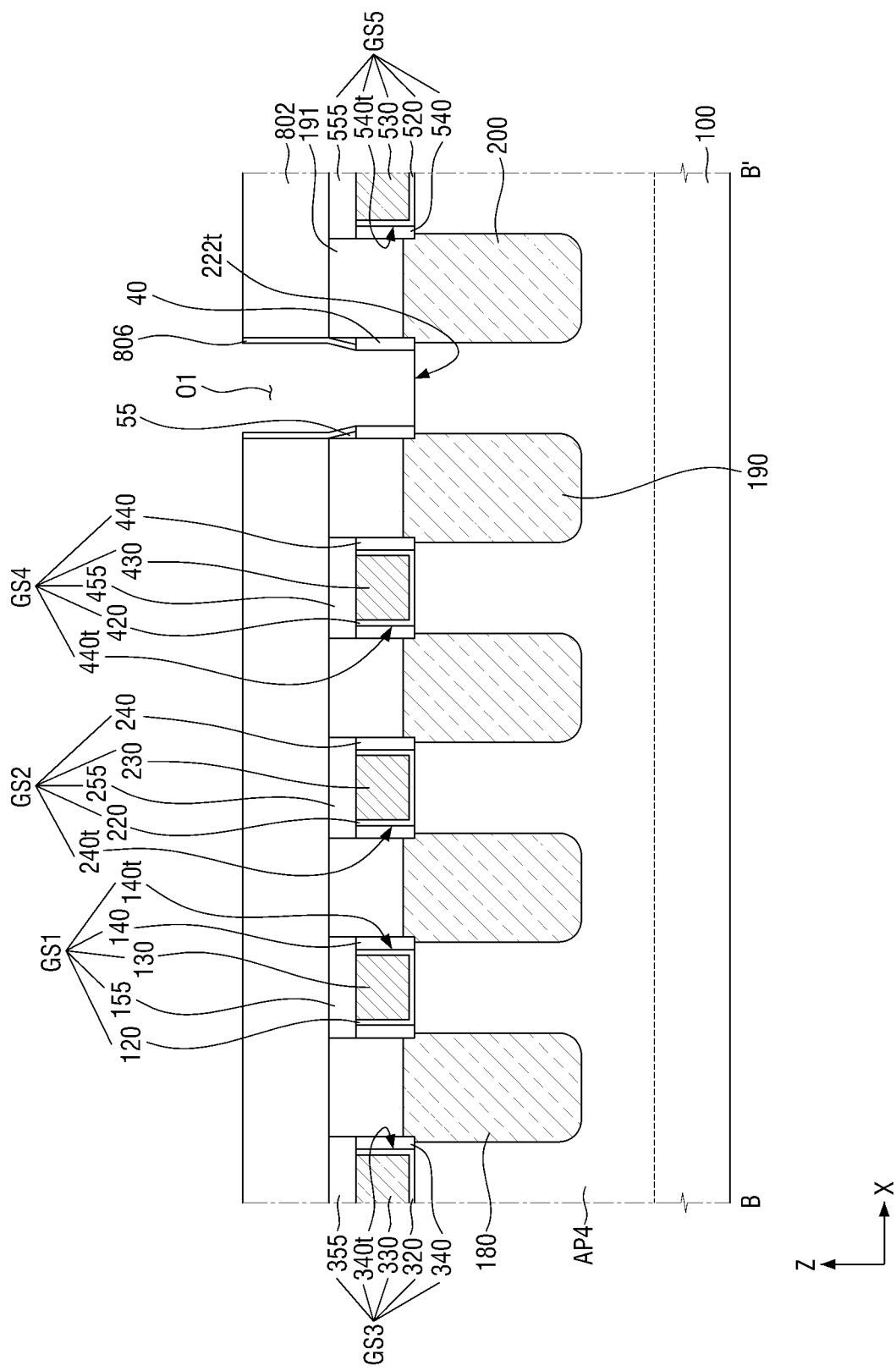

Referring to FIG. 13, a first liner 806 may be formed on the first sub-trench 211t. The first liner 806 may be conformally formed along the first sub-trench 211t. Then, the first liner 806 on the dummy gate electrode 30 and the dummy gate insulating layer 20 may be removed.

Next, the dummy gate electrode 30 and the dummy gate insulating layer 20 from which the first liner 806 has been removed may be removed, and a second sub-trench 222t may be formed. An upper surface of the fourth active pattern AP4 may be exposed by the second sub-trench 222t.

The first liner 806 may include the same material as, e.g., the first dummy capping pattern 55.

Figure 14:
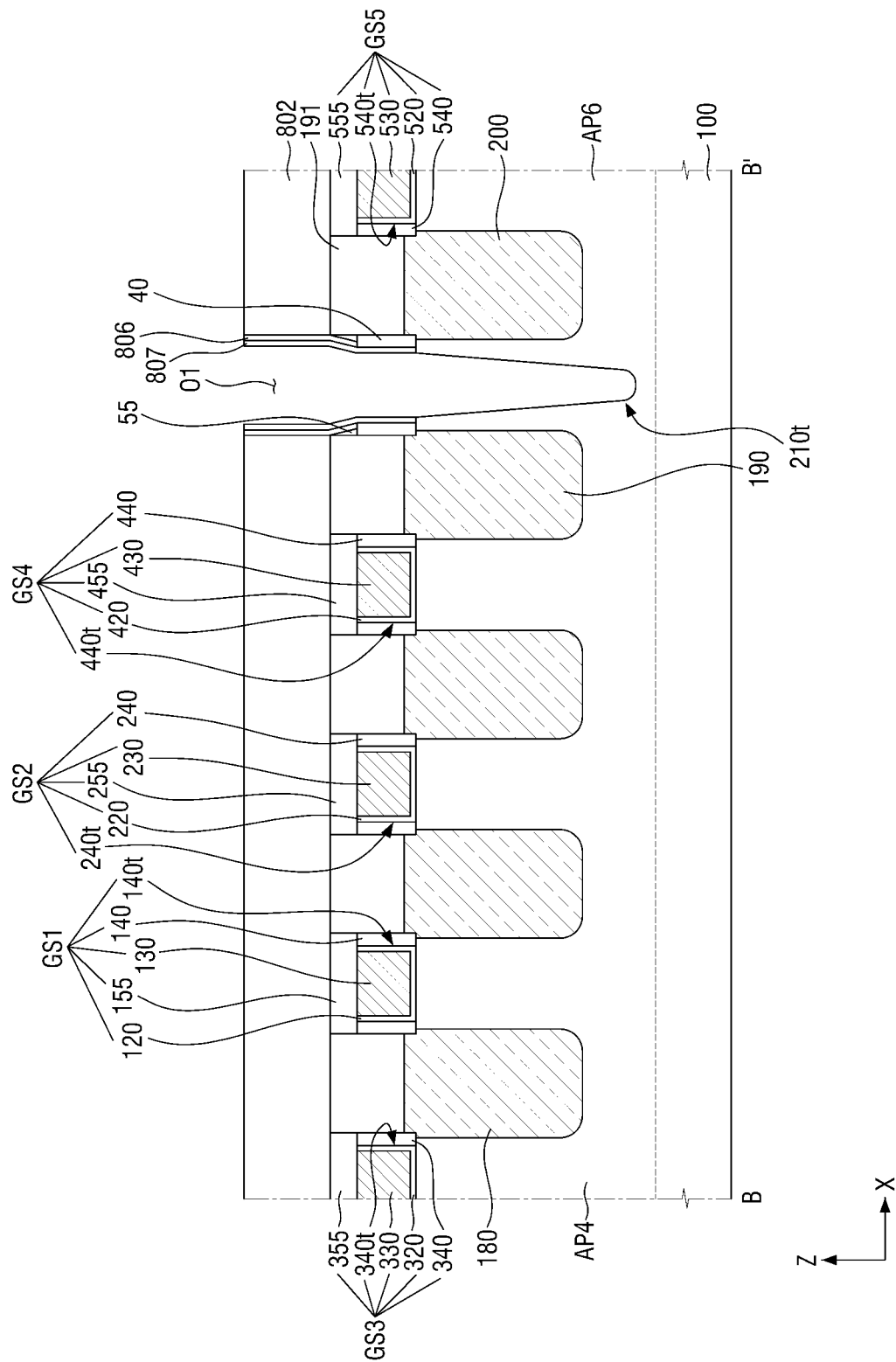

Referring to FIG. 14, a second liner 807 may be formed on the second sub-trench 222t. The second liner 807 may be conformally formed along the second sub-trench 222t. Then, the second liner 807 on the fourth active pattern AP4 may be removed. The fourth active pattern AP4 from which the second liner 807 has been removed may be etched. Accordingly, a first separation trench 210t may be formed. The fourth active pattern AP4 may be separated from a sixth active pattern AP6 by the first separation trench 210t.

The second liner 807 may include the same material as, e.g., first and second element isolation layers 210 and 215.

Figure 15:
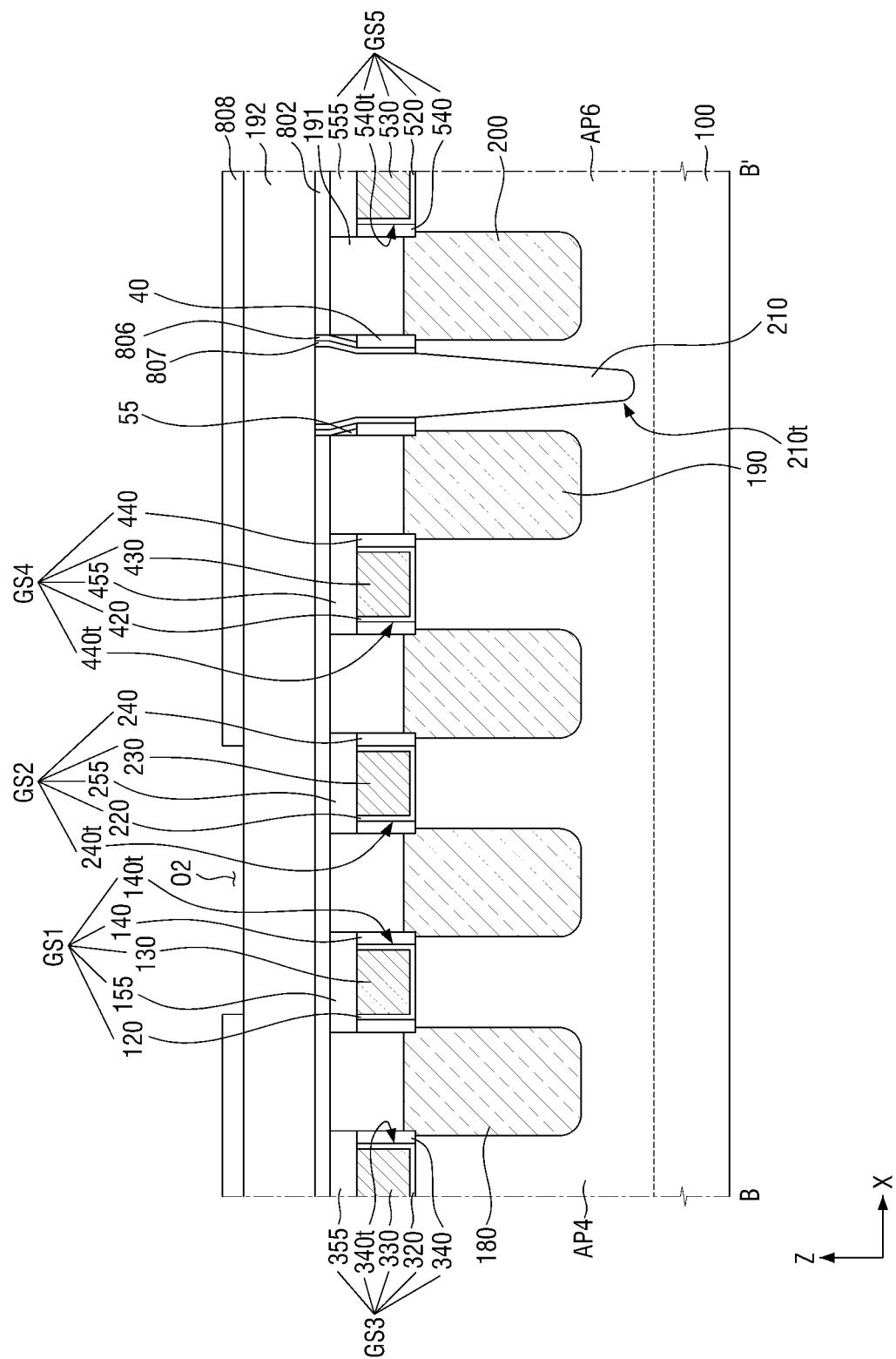

Referring to FIG. 15, the first element isolation layer 210 may be formed on the first separation trench 210t and the sub-insulating layer 802, and then a planarization process may be performed. Accordingly, the first separation trench 210t may be filled with the first element isolation layer 210, and an upper surface of the first element isolation layer 210 and an upper surface of the sub-insulating layer 802 may lie in the same plane.

Next, a second interlayer insulating film 192 may be formed on the first element isolation layer 210 and the sub-insulating layer 802. A second mask pattern 808 having a second opening O2 may be formed on the second interlayer insulating film 192. The second opening O2 may expose the second interlayer insulating film 192 on the first gate structure GS1, the second gate structure GS2, and a fifth source/drain region 190 disposed between the first gate structure GS1 and the second gate structure GS2. The second opening O2 may extend, e.g., in the second direction Y (see FIG. 1).

Figure 16:
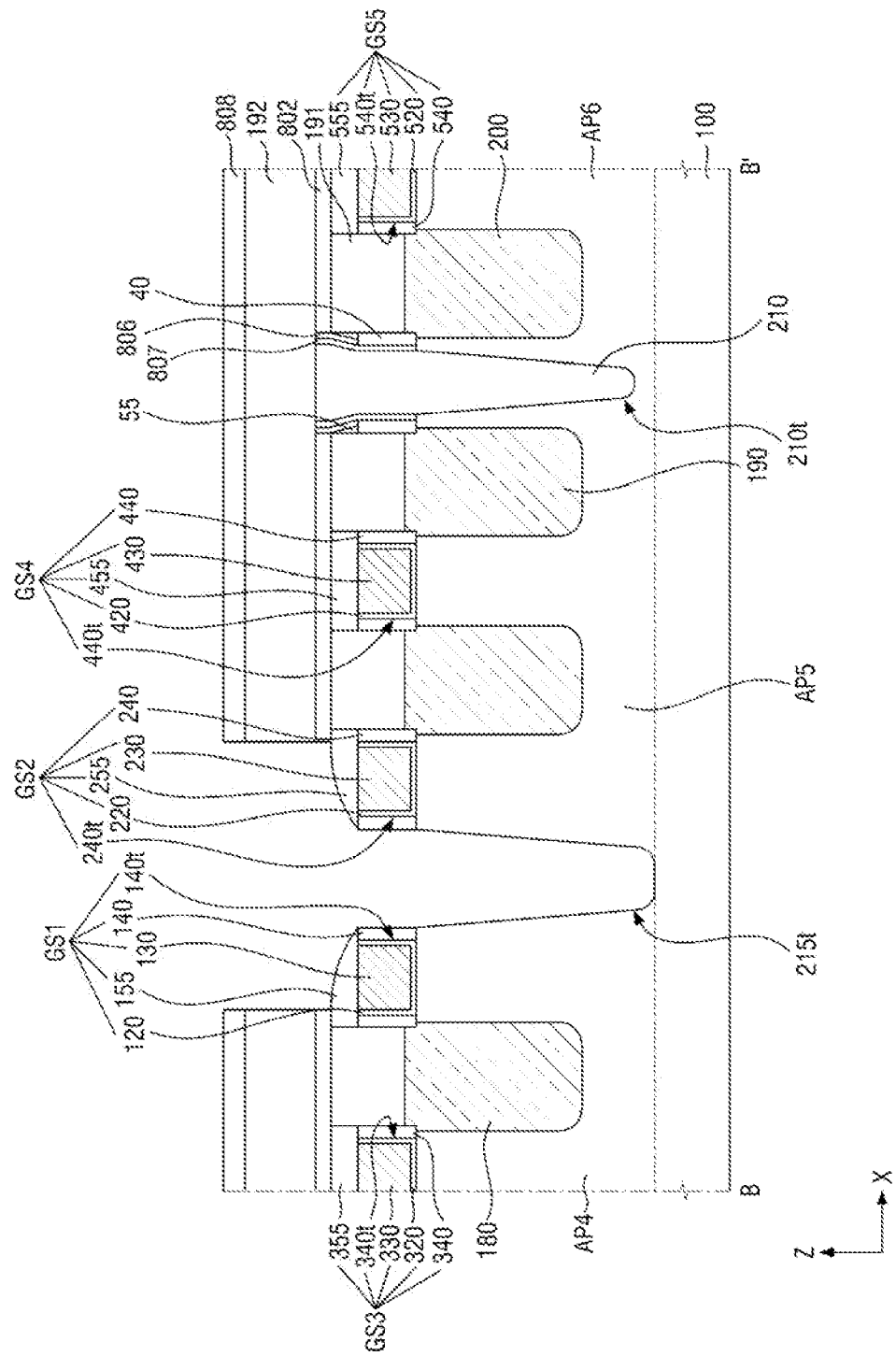

Referring to FIG. 16, the upper surface of the first gate structure GS1, the upper surface of the second gate structure GS2, and the fifth source/drain region 190 between the first gate structure GS1 and the second gate structure GS2 may be etched using the second mask pattern 808 as an etch mask. Accordingly, a second separation trench 215t may be formed. Here, a bottom surface of the second separation trench 215t may be lower than a bottom surface of the first separation trench 210t.

In addition, a part of the first capping pattern 155 and a part of the second capping pattern 255 may be removed. Accordingly, a width of the second separation trench 215t in the first direction X may increase from the substrate 100 toward the third direction Z. In addition, the second separation trench 215t that contacts each of the first and second capping patterns 155 and 255 may form a curve (e.g., may have a curved surface).

Next, the second mask pattern 808 may be removed.

Figure 17:
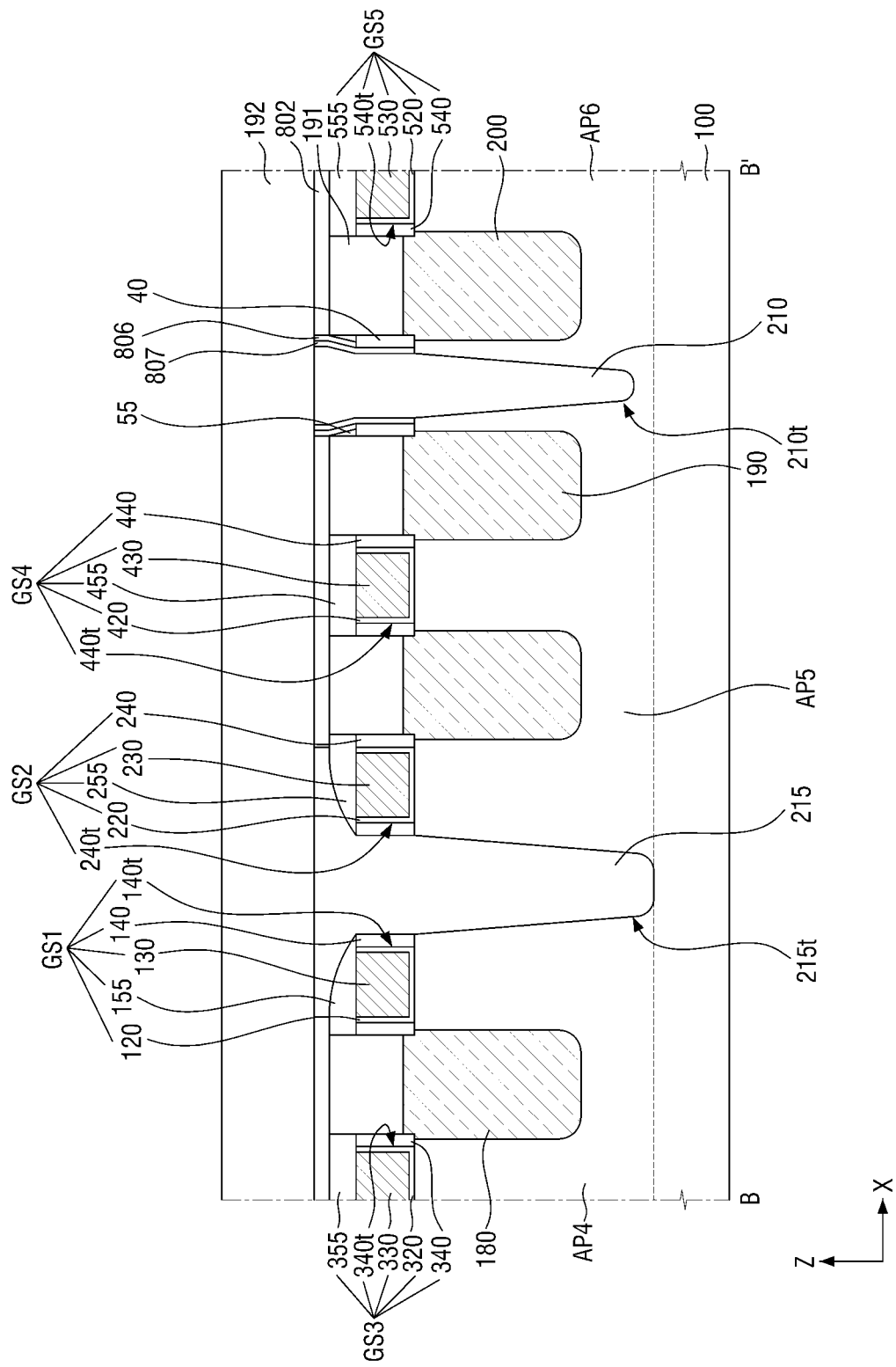

Referring to FIG. 17, the second element isolation layer 215 may be formed on the second separation trench 215t and the sub-insulating layer 802, and then a planarization process may be performed. Accordingly, the second separation trench 215t may be filled with the second element isolation layer 215, and the upper surface of the first element isolation layer 210, the upper surface of the sub-insulating layer 802 and an upper surface of the second element isolation layer 215 may lie in the same plane.

In an implementation, the sub-insulating layer 802 may remain, as illustrated in the drawings, or it may be entirely removed by a planarization process. In an implementation, the upper surfaces of the first and second element isolation layers 210 and 215 and the first through fifth gate structures GS1 through GS5 may lie in the same plane.

Next, the second interlayer insulating film 192 may fill on the sub-insulating layer 802 and the first and second element isolation layers 210 and 215. Referring to FIGS. 1 and 4, contacts 195, a third interlayer insulating film 193, and wiring structures 185 may be formed.

Figure 18:
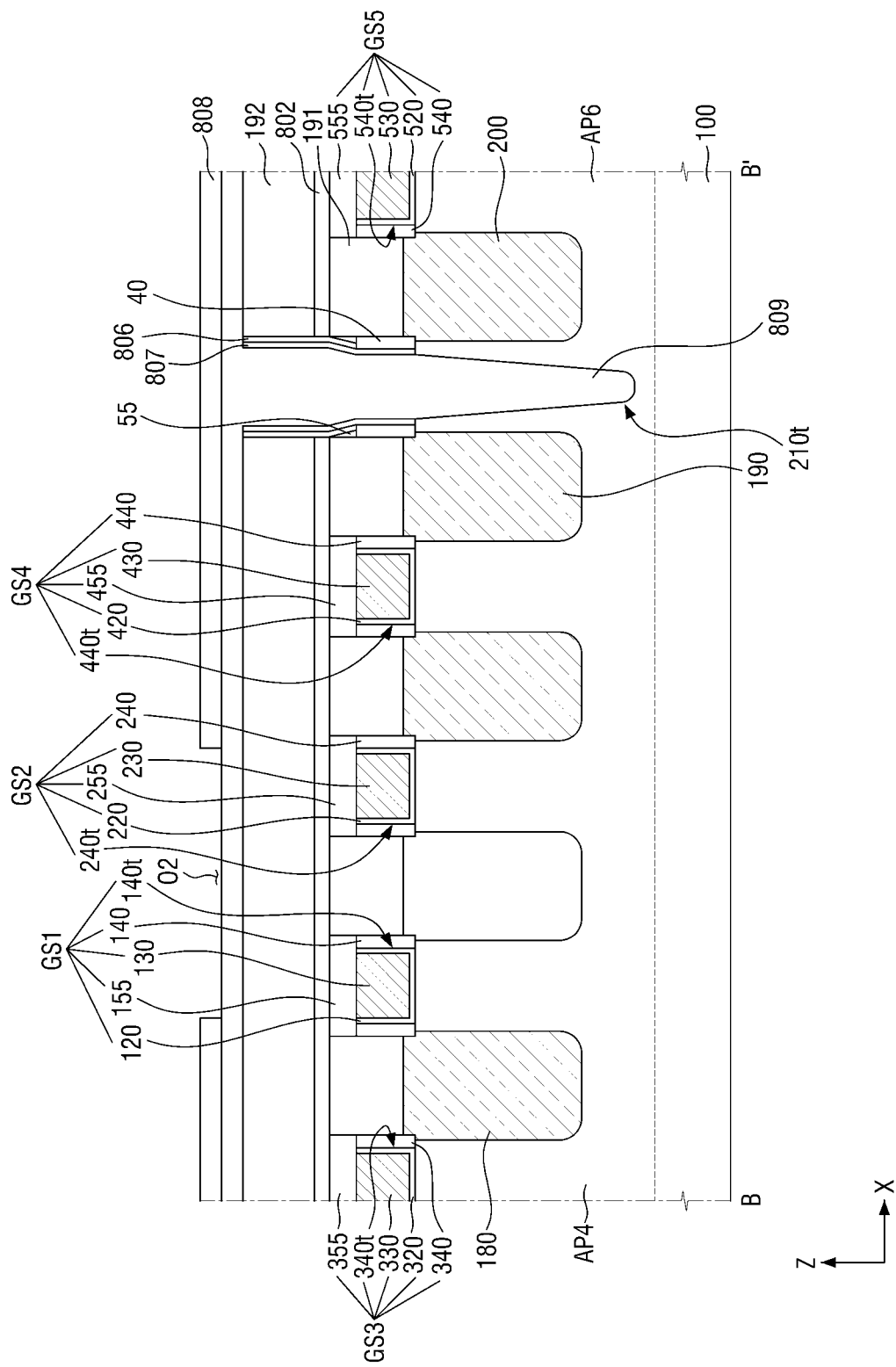
FIGS. 18 through 20 illustrate stages in a method of manufacturing a semiconductor device according to some embodiments of the present disclosure.
Figure 19:
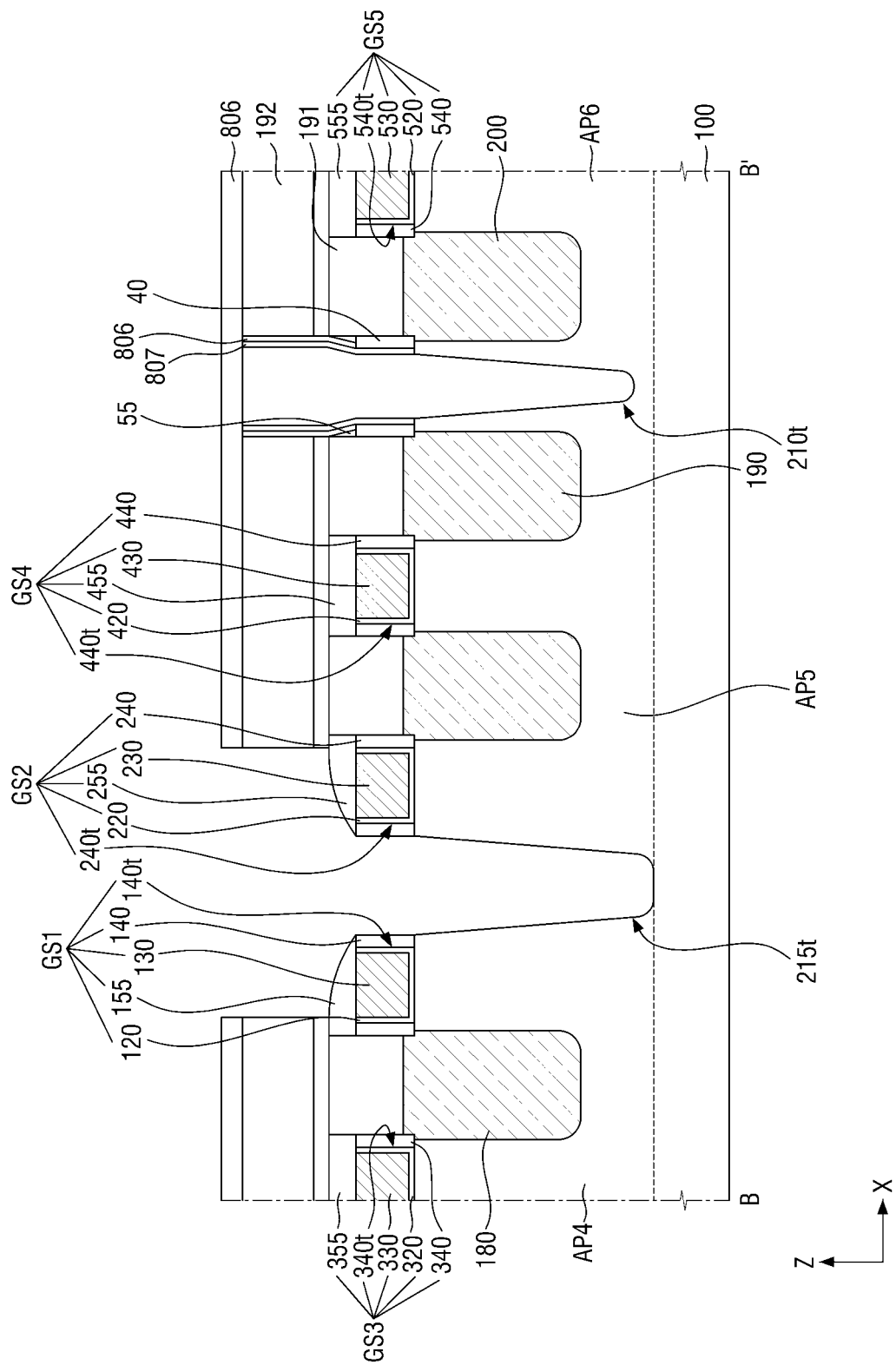
Figure 20:
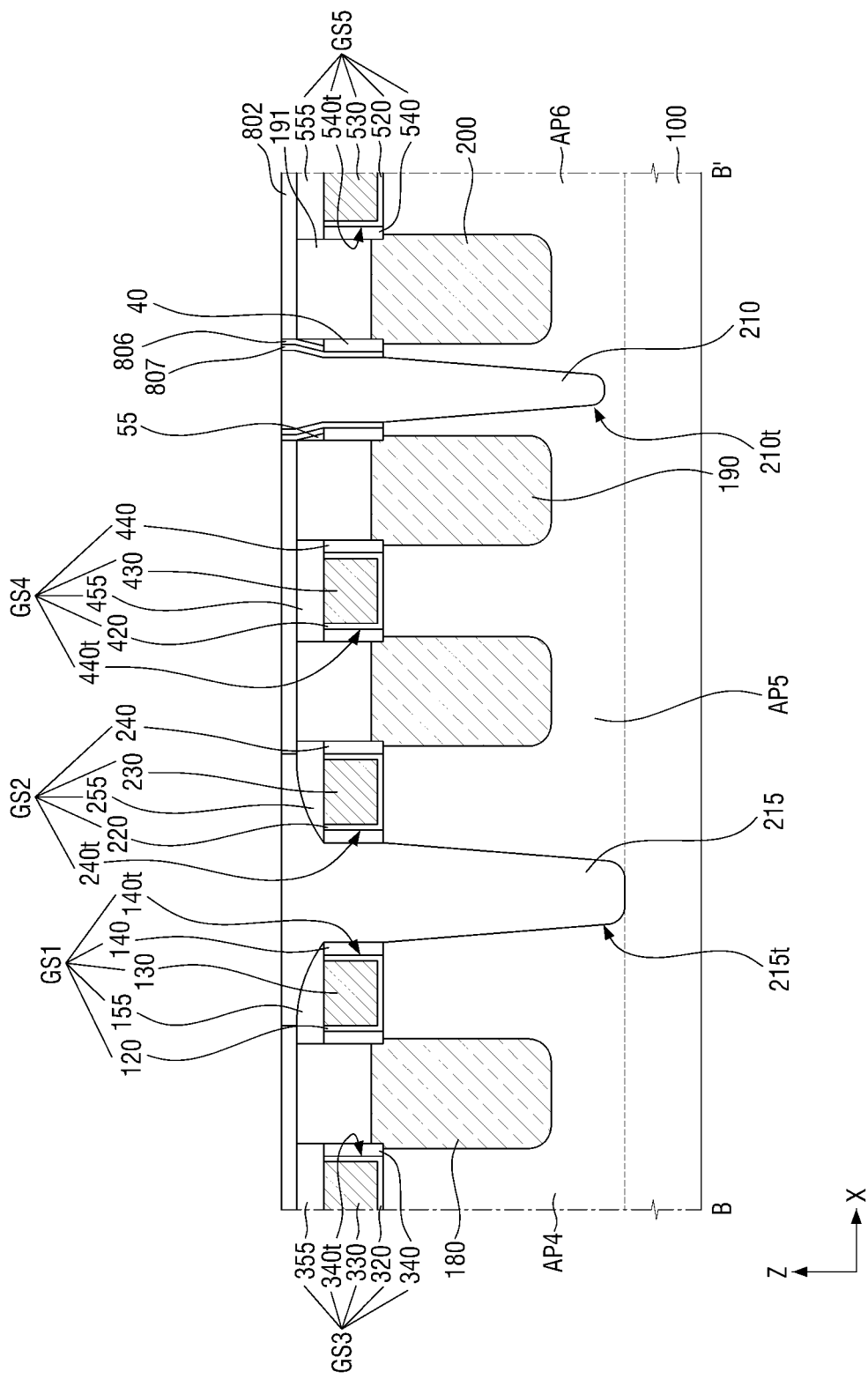

FIGS. 18 through 20 illustrate operations in a method of manufacturing a semiconductor device according to embodiments of the present disclosure. FIG. 18 is a view after FIG. 14. For ease of description, a repeated description of the same operations as those described using FIGS. 12 through 17 will be given briefly or omitted.

Referring to FIG. 18, a protective layer 809 may be formed on a first separation trench 210t and a sub-insulating layer 802. The protective layer 809 may fill the first separation trench 210t. Then, a second mask pattern 808 including a second opening O2 may be formed on the protective layer 809. The second opening O2 may expose the sub-insulating layer 802 on a first gate structure GS1 and a second gate structure GS2. The second opening O2 may extend in, e.g., the second direction Y (see FIG. 1).

Referring to FIG. 19, a second separation trench 215t may be formed using the second mask pattern 808 as an etch mask. Then, the second mask pattern 808 may be removed.

Referring to FIG. 20, a second element isolation layer 215 may be formed on the second separation trench 215t and the sub-insulating layer 802, and then a planarization process may be performed. Here, a lower surface of the second separation trench 215t may be lower than a lower surface of a first separation trench 210t. Accordingly, the second separation trench 215t may be filled with the second element isolation layer 215, and an upper surface of the second element isolation layer 215, an upper surface of the sub-insulating layer 802, and an upper surface of a first element isolation layer 210 may lie in the same plane. As described above, the upper surfaces of the first and second element isolation layers 210 and 215 and first through fifth gate structures GS1 through GS5 may lie in the same plane.

Next, a second interlayer insulating film 192 may fill on the second element isolation layer 215. The sub-insulating layer 802 may be included in the second interlayer insulating film 192. Referring to FIGS. 1 through 4, contacts 195, a third interlayer insulating film 193, and wiring structures 185 may be formed.

In an implementation, the first separation trench 210t may be formed using the first mask pattern 804 and the second separation trench 215t may be formed using the second mask pattern 808, as illustrated in FIGS. 12 through 20, or the first separation trench 210t and the second separation trench 215t may be formed using one mask pattern. In this case, the bottom surfaces of the first separation trench 210t and the second separation trench 215t may respectively be higher than the bottom surfaces of the first separation trench 210t and the second separation trench 215t formed using the first mask pattern 804 and the second mask pattern 808. In an implementation, the bottom surface of the first separation trench 210t may be higher than the bottom surface of the second separation trench 215t.

By way of summation and review, a multi-gate transistor may be easily scaled because it uses a three-dimensional (3D) channel. In addition, the current control capability of the multi-gate transistor may be improved without increasing the gate length of the multi-gate transistor. Moreover, it is possible to effectively suppress a short channel effect (SCE) in which an electric potential of a channel region is affected by a drain voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first active pattern that extends in a first direction;
a second active pattern that extends in the first direction and is spaced apart from the first active pattern in the first direction;
a third active pattern that extends in the first direction and is spaced apart from the second active pattern in the first direction;
a fourth active pattern that extends in the first direction and is spaced apart from the first active pattern in a second direction perpendicular to the first direction;
a fifth active pattern that extends in the first direction and is spaced apart from the fourth active pattern in the first direction;
a sixth active pattern that extends in the first direction and is spaced apart from the fifth active pattern in the first direction;
a field insulating layer between the first active pattern and the second active pattern, an upper surface of the field insulating layer being lower than an upper surface of the first active pattern and lower than an upper surface of the second active pattern;
a first gate structure on the field insulating layer and the first active pattern, the first gate structure extending in the second direction to intersect the fourth active pattern;
a second gate structure on the field insulating layer and the second active pattern, the second gate structure extending in the second direction to intersect the fifth active pattern;
a first separation trench extending in the second direction between the second active pattern and the third active pattern and between the fifth active pattern and the sixth active pattern, the first separation trench including a first element isolation layer filled therein; and a second separation trench extending in the second direction between the first gate structure and the second gate structure, the second separation trench including a second element isolation layer filled therein, wherein a lowest surface of the first separation trench is higher than a lowest surface of the second separation trench.

2. The semiconductor device as claimed in claim 1, wherein:
the first through third active patterns are in a first area of the semiconductor device, and
the fourth through sixth active patterns are in a second area of the semiconductor device that is different from the first area.

3. The semiconductor device as claimed in claim 1, wherein the second separation trench exposes at least a part of an upper surface of the first gate structure and at least a part of an upper surface of the second gate structure.

4. The semiconductor device as claimed in claim 3, wherein a surface of the second element isolation layer that contacts the first gate structure or the second gate structure is curved.

5. The semiconductor device as claimed in claim 1, wherein:
the first gate structure includes a first capping pattern,
the second gate structure includes a second capping pattern, and
the first capping pattern and the second capping pattern define at least a part of the second separation trench.

6. The semiconductor device as claimed in claim 1, wherein a width of the first separation trench in the first direction is smaller than a width of the second separation trench in the first direction.

7. The semiconductor device as claimed in claim 1, wherein an upper surface of the first element isolation layer lies in substantially the same plane as an upper surface of the second element isolation layer.

8. The semiconductor device as claimed in claim 1, wherein the second element isolation layer contacts the first gate structure or the second gate structure.

9. The semiconductor device as claimed in claim 1, further comprising:
a seventh active pattern that extends in the first direction between the fourth active pattern and the fifth active pattern; and
a third gate structure on the seventh active pattern and the field insulating layer, the third gate structure extending in the second direction,
wherein:
the second separation trench includes a third separation sub-trench that separates the fourth active pattern and the seventh active pattern and a fourth separation sub-trench that separates the seventh active pattern and the fifth active pattern, and
an upper part of the third separation sub-trench is connected to an upper part of the fourth separation sub-trench on the seventh active pattern.

10. The semiconductor device as claimed in claim 9, wherein:
the third gate structure includes a gate electrode, and
the second separation trench exposes the gate electrode.

11. The semiconductor device as claimed in claim 9, wherein:
the second element isolation layer covers an upper surface of the third gate structure, and the upper surface of the second element isolation layer lies in substantially the same plane as the upper surface of the first gate structure or the upper surface of the second gate structure.

12. A semiconductor device, comprising:
a first active pattern and a second active pattern that are separated by a first separation trench and that extend in a first direction;
a third active pattern that is spaced apart from the first active pattern in a second direction and that extends in the first direction;
a fourth active pattern that is spaced apart from the second active pattern in the second direction and that extends in the first direction;
at least one first wire pattern on the first active pattern, spaced apart from the first active pattern in a third direction, and partially overlapping the first active pattern;
at least one second wire pattern on the second active pattern, spaced apart from the second active pattern in the third direction, and partially overlapping the second active pattern;
at least one third wire pattern on the third active pattern and spaced apart from the third active pattern in the third direction;
at least one fourth wire pattern on the fourth active pattern and spaced apart from the fourth active pattern in the third direction;
a first gate structure that covers the at least one first wire pattern and the at least one third wire pattern and extends in the second direction;
a second gate structure that covers the at least one second wire pattern and the at least one fourth wire pattern and extends in the second direction;
a fifth active pattern that extends in the first direction;
a sixth active pattern that is spaced apart from the fifth active pattern in the second direction; and
a first element isolation layer that separates the second active pattern and the fifth active pattern and separates the fourth active pattern and the sixth active pattern,
wherein:
the third active pattern and the fourth active pattern are separated by a second separation trench,
a width of the first separation trench in the first direction is greater than a width of the second separation trench in the first direction,
a depth of the first element isolation layer in the third direction is smaller than a depth of the second separation trench in the third direction.

13. The semiconductor device as claimed in claim 12, further comprising a field insulating layer that fills at least a part of the first separation trench, wherein a part of the first gate structure and a part of the second gate structure are on the field insulating layer.

14. The semiconductor device as claimed in claim 12, further comprising a second element isolation layer that fills the second separation trench, wherein the second element isolation layer at least partially covers upper surfaces of the first gate structure and the second gate structure.

15. The semiconductor device as claimed in claim 12, wherein the second separation trench is at least partially defined by facing sidewalls of the at least one third wire pattern and the at least one fourth wire pattern.

16. The semiconductor device as claimed in claim 12, wherein:

each of the at least one first through fourth wire patterns includes a plurality of first through fourth wire patterns, and the plurality of first through fourth wire patterns are each stacked in the third direction.

17. The semiconductor device as claimed in claim 12, wherein a width of the second separation trench in the second direction increases as a distance from a lower surface of the first gate structure increases.

18. A semiconductor device, comprising:
a first active pattern and a second active pattern on a first area of a substrate, the first active pattern and the second active pattern each extending in a first direction and being spaced apart from each other in the first direction;
a third active pattern on the first area of the substrate, the third active pattern extending in the first direction and being separated from the second active pattern by a first element isolation layer;
a fourth active pattern on a second area of the substrate, the fourth active pattern extending in the first direction and being spaced apart from the first active pattern in a second direction;
a fifth active pattern on the second area of the substrate, the fifth active pattern extending in the first direction and being separated from the fourth active pattern by a second element isolation layer;
a sixth active pattern on the second area of the substrate, the sixth active pattern extending in the first direction and being separated from the fifth active pattern by the first element isolation layer;
a first gate structure that extends in the second direction, overlaps an end of the first active pattern, and intersects the fourth active pattern;
a second gate structure that extends in the second direction, overlaps an end of the second active pattern, and intersects the fifth active pattern;
source/drain regions on the first through sixth active patterns;
a field insulating layer between the first active pattern and the second active pattern, an upper surface of the field insulating layer being lower than an upper surface of the first active pattern and lower than upper surface of the second active pattern;
a first interlayer insulating film on an upper surface of the first gate structure and an upper surface of the second gate structure;
contacts in the first interlayer insulating film, the contacts being connected to the source/drain regions;
a second interlayer insulating film on the first interlayer insulating film and the contacts; and
wiring structures in the second interlayer insulating film and connected to the contacts,
wherein:
the second element isolation layer is between the first gate structure and the second gate structure,
an upper surface of the first element isolation layer or an upper surface of the second element isolation layer is lower than upper surfaces of the contacts,
a lower surface of the first element isolation layer or a lower surface of the second element isolation layer is lower than lower surfaces of the source/drain regions,
a depth of the first element isolation layer in a third direction is smaller than a depth of the second element isolation layer in the third direction.

19. The semiconductor device as claimed in claim 18, wherein:
the first element isolation layer covers the upper surface of the first gate structure and the upper surface of the second gate structure, and
the second interlayer insulating film is on the upper surface of the first element isolation layer and the upper surface of the second element isolation layer.

* * * * *